US012166062B2

(12) United States Patent
Tanaka et al.

(10) Patent No.: US 12,166,062 B2
(45) Date of Patent: Dec. 10, 2024

(54) SOLID-STATE IMAGING DEVICE, DRIVING METHOD THEREFOR, AND ELECTRONIC APPARATUS

(71) Applicant: SONY GROUP CORPORATION, Tokyo (JP)

(72) Inventors: Akira Tanaka, Kanagawa (JP); Shohei Shimada, Tokyo (JP)

(73) Assignee: Sony Group Corporation, Tokyo (JP)

( * ) Notice: Subject to any disclaimer, the term of this patent is extended or adjusted under 35 U.S.C. 154(b) by 0 days.

(21) Appl. No.: 18/486,818

(22) Filed: Oct. 13, 2023

(65) Prior Publication Data

US 2024/0047502 A1 Feb. 8, 2024

Related U.S. Application Data

(63) Continuation of application No. 17/524,969, filed on Nov. 12, 2021, now Pat. No. 11,916,093, which is a (Continued)

(30) Foreign Application Priority Data

Jan. 20, 2016 (JP) .................................. 2016-008728

(51) Int. Cl.
*H01L 27/146* (2006.01)
*H04N 25/13* (2023.01)
(Continued)

(52) U.S. Cl.
CPC ...... *H01L 27/14643* (2013.01); *H01L 27/146* (2013.01); *H01L 27/14605* (2013.01);
(Continued)

(58) Field of Classification Search
CPC ............. H01L 27/14643; H01L 27/146; H01L 27/14605; H01L 27/14612;
(Continued)

(56) References Cited

U.S. PATENT DOCUMENTS

| 11,201,186 B2 | 12/2021 | Tanaka et al. |
| 2006/0092482 A1 | 7/2006 | Yano et al. |

(Continued)

FOREIGN PATENT DOCUMENTS

| JP | 2001-250931 | 9/2001 |
| JP | 2006-157882 | 6/2006 |

(Continued)

OTHER PUBLICATIONS

International Search Report and Written Opinion for International (PCT) Patent Application No. PCT/JP2017/000188, dated Mar. 14, 2017, 10 pages.

(Continued)

*Primary Examiner* — Robert G Bachner
(74) *Attorney, Agent, or Firm* — SHERIDAN ROSS P.C.

(57) ABSTRACT

The present technology relates to a solid-state imaging device, a driving method therefor, and an electronic apparatus capable of acquiring a signal to detect phase difference and a signal to generate a high dynamic range image at the same time. The solid-state imaging device includes a pixel array unit in which a plurality of pixels that receives light of a same color is arranged under one on-chip lens. The plurality of pixels uses at least one pixel transistor in a sharing manner, some pixels out of the plurality of pixels are set to have a first exposure time, and other pixels are set to have a second exposure time shorter than the first exposure time. The present technology can be applied to, for example, a solid-state imaging device or the like.

20 Claims, 27 Drawing Sheets

Related U.S. Application Data continuation of application No. 16/069,652, filed as application No. PCT/JP2017/000188 on Jan. 6, 2017, now Pat. No. 11,201,186.

(51) Int. Cl.
*H04N 25/17* (2023.01)
*H04N 25/57* (2023.01)
*H04N 25/583* (2023.01)
*H04N 25/702* (2023.01)
*H04N 25/704* (2023.01)
*H04N 25/76* (2023.01)
*H04N 25/778* (2023.01)

(52) U.S. Cl.
CPC .. *H01L 27/14612* (2013.01); *H01L 27/14641* (2013.01); *H01L 27/14645* (2013.01); *H01L 27/14647* (2013.01); *H01L 27/14667* (2013.01); *H04N 25/134* (2023.01); *H04N 25/136* (2023.01); *H04N 25/17* (2023.01); *H04N 25/57* (2023.01); *H04N 25/583* (2023.01); *H04N 25/702* (2023.01); *H04N 25/704* (2023.01); *H04N 25/76* (2023.01); *H04N 25/778* (2023.01); *H01L 27/14621* (2013.01); *H01L 27/14627* (2013.01)

(58) Field of Classification Search
CPC ......... H01L 27/14641; H01L 27/14645; H01L 27/14647; H01L 27/14667; H01L 27/14621; H01L 27/14627; H04N 25/134; H04N 25/136; H04N 25/17; H04N 25/57; H04N 25/583; H04N 25/702; H04N 25/704; H04N 25/76; H04N 25/778
See application file for complete search history.

(56) References Cited

U.S. PATENT DOCUMENTS

| | | |
|---|---|---|
| 2014/0071244 A1 | 3/2014 | Hirota |
| 2017/0013217 A1* | 1/2017 | Lee ...................... H04N 25/585 |
| 2017/0104942 A1 | 4/2017 | Hirota et al. |
| 2017/0294485 A1 | 10/2017 | Joei et al. |
| 2022/0077220 A1 | 3/2022 | Tanaka et al. |

FOREIGN PATENT DOCUMENTS

| | | |
|---|---|---|
| JP | 2012-213137 | 11/2012 |
| JP | 2013-057915 | 3/2013 |
| JP | 2015-201834 | 11/2015 |
| WO | WO 2012/161225 | 11/2012 |
| WO | WO 2012/169127 | 12/2012 |
| WO | WO 2016/002574 | 1/2016 |

OTHER PUBLICATIONS

Official Action for U.S. Appl. No. 16/069,652, dated Sep. 19, 2019, 13 pages.
Official Action for U.S. Appl. No. 16/069,652, dated Jan. 3, 2020, 24 pages.
Official Action for U.S. Appl. No. 16/069,652, dated Apr. 30, 2020, 24 pages.
Official Action for U.S. Appl. No. 16/069,652, dated Sep. 30, 2020, 22 pages.
Official Action for U.S. Appl. No. 16/069,652, dated Jan. 25, 2021, 24 pages.
Official Action for U.S. Appl. No. 16/069,652, dated May 4, 2021, 25 pages.
Notice of Allowance for U.S. Appl. No. 16/069,652, dated Aug. 13, 2021, 7 pages.
Notice of Allowance for U.S. Appl. No. 17/524,969, dated Oct. 4, 2023, 7 pages.

* cited by examiner

SOLID-STATE IMAGING DEVICE, DRIVING METHOD THEREFOR, AND ELECTRONIC APPARATUS

CROSS REFERENCE TO RELATED APPLICATIONS

This application is a continuation of and claims priority to U.S. application Ser. No. 17/524,969, filed Nov. 12, 2021, which is a continuation of and claims priority to U.S. application Ser. No. 16/069,652, filed Jul. 12, 2018, now U.S. Pat. No. 11,201,186, which is a national stage application under 35 U.S.C. 371 and claims the benefit of PCT Application No. PCT/JP2017/000188 having an international filing date of Jan. 6, 2017, which designated the United States, which PCT application claimed the benefit of Japanese Patent Application No. 2016-008728 filed Jan. 20, 2016, the entire disclosures of each of which are incorporated herein by reference.

TECHNICAL FIELD

The present technology relates to a solid-state imaging device, a driving method therefor, and an electronic apparatus, and more particularly relates to a solid-state imaging device, a driving method therefor, and an electronic apparatus capable of acquiring a signal to detect phase difference and a signal to generate a high dynamic range image at the same time.

BACKGROUND ART

There is a proposed structure in which a plurality of light receiving regions is formed for one on-chip lens and a separating region under the on-chip lens is prevented from light shielding, thereby reducing nonuniformity of sensitivity in the plurality of light receiving regions under an on-chip lens (refer to Patent Document 1, for example).

CITATION LIST

Patent Document

Patent Document 1: Japanese Patent Application Laid-Open No. 2001-250931

SUMMARY OF THE INVENTION

Problems to be Solved by the Invention

However, in a structure of Patent Document 1, a signal to detect a phase difference can be acquired by using a light reception signal in each of a plurality of light receiving regions under an on-chip lens, but a signal to generate a high dynamic range image cannot be acquired because an exposure time cannot be changed in the plurality of light receiving regions.

The present technology has been made in view of the above-described situation, and is directed to achieving simultaneous acquisition of a signal to detect a phase difference and a signal to generate a high dynamic range image.

Solutions to Problems

A solid-state imaging device according to a first aspect of the present technology includes a pixel array unit in which a plurality of pixels that receives light of a same color is arranged under one on-chip lens, the plurality of pixels uses at least one pixel transistor in a sharing manner, some pixels out of the plurality of pixels are set to have a first exposure time, and other pixels are set to have a second exposure time shorter than the first exposure time.

A driving method for a solid-state imaging device according to a second aspect of the present technology includes a pixel array unit in which a plurality of pixels that receives light of a same color is arranged under one on-chip lens, the plurality of pixels uses at least one pixel transistor in a sharing manner, some pixels out of the plurality of pixels are set to have a first exposure time, and other pixels are set to have a second exposure time shorter than the first exposure time.

An electronic apparatus according to a third aspect of the present technology includes a solid-state imaging device having a pixel array unit in which a plurality of pixels that receives light of a same color is arranged under one on-chip lens, and in the pixel array unit, the plurality of pixels uses at least one pixel transistor in a sharing manner, some pixels out of the plurality of pixels are set to have a first exposure time, and other pixels are set to have a second exposure time shorter than the first exposure time.

According to the first to third aspects of the present technology, provided is the pixel array unit in which the plurality of pixels that receives light of the same color is arranged under one on-chip lens, at least one pixel transistor is used by the plurality of pixels in a sharing manner, some pixels out of the plurality of pixels are set to have the first exposure time, and other pixels are set to have the second exposure time shorter than the first exposure time.

The solid-state imaging device and the electronic apparatus may be independent devices or may also be modules incorporated in a different device.

Effects of the Invention

According to the first to third aspects of the present technology, a signal to detect a phase difference and a signal to generate a high dynamic range image can be acquired at the same time.

Note that the effects recited herein are not constantly limited and may be any one of those recited in the present disclosure.

MODE FOR CARRYING OUT THE INVENTION

Modes for carrying out the present technology (hereinafter referred to as "embodiments") will be described below. Note that the description will be provided in the following order.
1. First Embodiment (Exemplary configuration to implement image surface phase difference autofocus function and HDR function at the same time)
2. Second Embodiment (Exemplary configuration improving phase difference detection accuracy)
3. Exemplary Configuration of Electronic Apparatus 1. First Embodiment <Schematic Exemplary Configuration of Solid-State Imaging Device>

Figure 1:
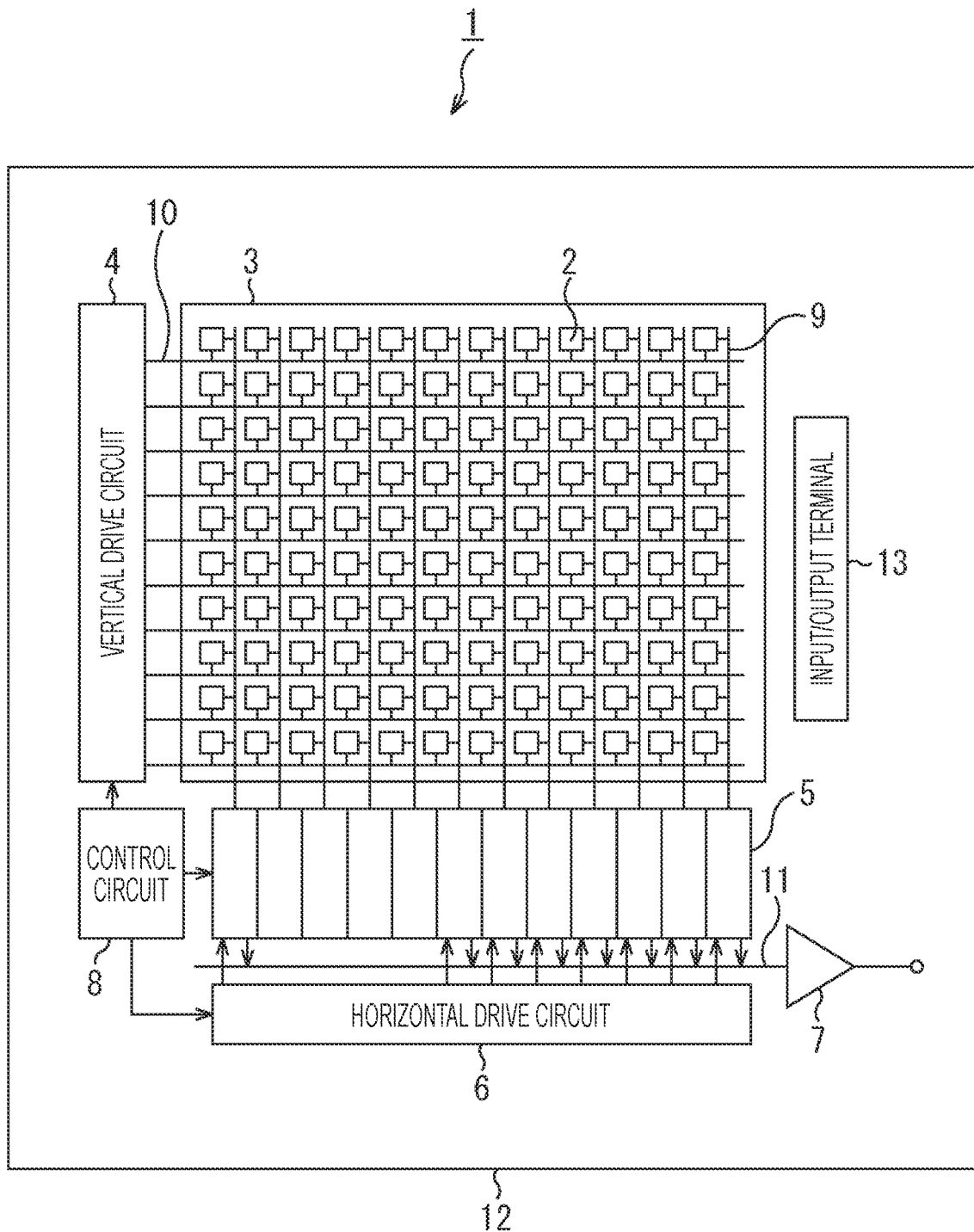
FIG. 1 is a diagram illustrating an exemplary configuration of a solid-state imaging device to which the present technology is applied.

FIG. 1 is a diagram illustrating a schematic configuration of a solid-state imaging device to which the present technology is applied.

A solid-state imaging device 1 of FIG. 1 includes a pixel array unit 3 and a peripheral circuit unit in the periphery thereof, and pixels (pixel regions) 2 are arrayed in a matrix on a semiconductor substrate 12 using, for example, silicon (Si) as a semiconductor in the pixel array unit. The peripheral circuit unit includes a vertical drive circuit 4, a column signal processing circuit 5, a horizontal drive circuit 6, an output circuit 7, a control circuit 8, and the like.

The control circuit 8 receives an input clock and data to command an operation mode and the like, and also outputs data such as internal information of the solid-state imaging device 1. More specifically, the control circuit 8 generates a clock signal and a control signal to be reference of operation of the vertical drive circuit 4, column signal processing circuit 5, horizontal drive circuit 6, and the like on the basis of a vertical synchronization signal, a horizontal synchronization signal, and a master clock. Furthermore, the control circuit 8 outputs the generated clock signal and control signal to the vertical drive circuit 4, column signal processing circuit 5, horizontal drive circuit 6, and the like.

The vertical drive circuit 4 includes a shift register, for example, and selects a pixel drive wire 10, supplies a pulse to the selected pixel drive wire 10 in order to drive a pixel 2, and drives pixels 2 per row. More specifically, the vertical drive circuit 4 selectively and sequentially scans each of the pixels 2 per row in the pixel array unit 3 in a vertical direction, and supplies the column signal processing circuit 5 with a pixel signal based on signal electric charge via a vertical signal line 9, in which the signal charge is generated in a photoelectric conversion unit in each pixel 2 in accordance with a light receiving amount.

The column signal processing circuit 5 is arranged per column of the pixels 2 and applies, per pixel column, signal processing such as noise removal to a signal output from each of pixels 2 included in one row. The column signal processing circuit 5 performs, for example, the signal processing such as correlated double sampling (CDS) to remove fixed-pattern noise unique to a pixel, and AD conversion.

The horizontal drive circuit 6 includes, for example, a shift register and sequentially outputs a horizontal scanning pulse, thereby sequentially selecting each of column signal processing circuits 5 and causing each of the column signal processing circuits 5 to output a pixel signal to a horizontal signal line 11.

The output circuit 7 outputs, via the horizontal signal line 11, each of signals sequentially supplied from the respective column signal processing circuits 5 after applying predetermined signal processing to the signals. The output circuit 7 may perform, for example, only buffering or may perform black level adjustment, correction of column variation, various kinds of digital signal processing, and the like. The input/output terminal 13 exchanges signals with the outside.

The solid-state imaging device 1 having the above-described configuration is a CMOS image sensor of a so-called column AD system in which the column signal processing circuit 5 that performs CDS processing and AD conversion processing is arranged per pixel column.

Pixel Circuit Diagram

In the solid-state imaging device 1 in FIG. 1, adopted is a shared pixel structure in which a reset transistor, an amplification transistor, and a selection transistor are shared by total sixteen pixels including four pixels in the vertical direction and four pixels in the lateral direction. In the following, the shared pixel structure of the solid-state imaging device 1 will be specifically described with reference to FIGS. 2 to 7. Note that illustration of some parts is omitted in the drawings in order to prevent the drawings from being complicated.

Figure 2:
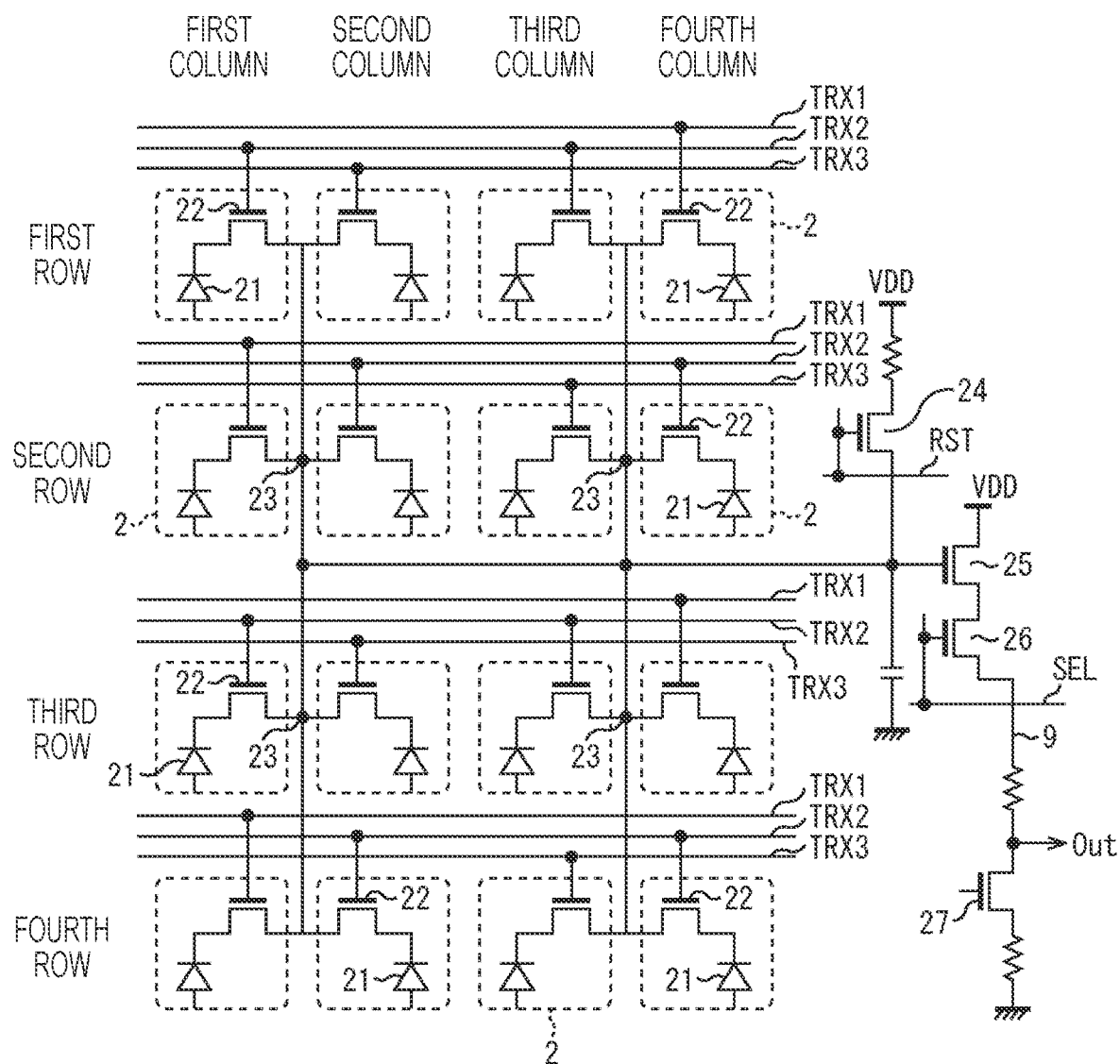
FIG. 2 is a pixel circuit diagram of the solid-state imaging device in FIG. 1.

FIG. 2 illustrates an equivalent circuit diagram of total sixteen pixels including four pixels in the vertical direction and four pixels in the lateral direction inside the pixel array unit 3.

In the description of FIG. 2, the description will be provided by defining respective rows arrayed in the vertical direction as a first row to a fourth row, and respective columns arrayed in the lateral direction as a first column to a fourth column.

In each of the pixels 2 in the pixel array unit 3, a photodiode 21 and a transfer transistor 22 to transfer electric charge accumulated in a photodiode 21 are individually arranged.

In each of the rows in the pixel array unit 3, arranged are three signal lines TRX1 to TRX3 each transmitting a drive signal to control the transfer transistor 22 in each of the pixels 2 arrayed in the row direction. In four pixels adjacent in the row direction of the first row, the transfer transistors 22 of the pixels 2 located in the first column and the third column are connected to the signal line TRX2, the transfer transistor 22 of the pixel 2 located in the second column is connected to the signal line TRX3, and the transfer transistor 22 of the pixel 2 in the fourth column is connected to the signal line TRX1. In four pixels adjacent in the row direction of the second row, the transfer transistor 22 of the pixel 2 in the first column is connected to the signal line TRX1, the transfer transistors 22 of the pixels 2 in the second and fourth columns are connected to the signal line TRX2, and the transfer transistor 22 of the pixel 2 in the third column is connected to the signal line TRX3. The transfer transistors 22 of four pixels located in the third row are connected in the same manner as the transfer transistors 22 of the pixels 2 located at the same positions in the first row, and the transfer transistors 22 of four pixels located in the fourth row are connected in the same manner as the transfer transistors 22 of the pixels 2 located at the same positions in the second row.

A floating diffusion region (FD) 23 is provided in a manner shared by four adjacent pixels including two in the vertical direction and two in the lateral direction, and therefore, total four FDs 23 are provided in sixteen pixels including four pixels in the vertical direction and four pixels in the lateral direction.

One reset transistor 24, one amplification transistor 25, and one selection transistor 26 are provided and used in a shared manner by the sixteen pixels constituting a sharing unit.

A photodiode 21 receives incident light, and generates and accumulates photoelectric charge.

When a drive signal supplied to a gate electrode of a transfer transistor 22 via a signal line TRX (any one of TRX1 to TRX3) becomes an active state, the transfer transistor 22 becomes conductive in response to the active state, thereby transferring photoelectric charge accumulated in a photodiode 21 to an FD 23 shared with other three pixels. Additionally, the charge accumulated in the photodiode 21 till then can be discharged by simultaneously turning on the transfer transistor 22 and the reset transistor 24 immediately before starting exposure of the photodiode 21, and an exposure time for the photodiode 21 can be adjusted.

An FD 23 temporarily holds photoelectric charge supplied from a photodiode 21 of at least one pixel out of four pixels sharing the FD 23.

When a drive signal supplied to a gate electrode of the reset transistor 24 via a signal line RST becomes an active state, the reset transistor 24 becomes conductive in response to the active state, thereby resetting a potential of each of the four FDs 23 to a predetermined level (reset voltage VDD).

The amplification transistor 25 has a source electrode connected to a vertical signal line 9 via the selection transistor 26, thereby constituting a source follower circuit together with a load MOS 27 of a constant current source circuit unit connected to one end of the vertical signal line 9. A pixel signal indicating a level according to electric charge held in each FD 23 is output from the amplification transistor 25 to the column signal processing circuit 5 (FIG. 1) via the selection transistor 26. The load MOS 27 is provided, for example, inside the column signal processing circuit 5.

The selection transistor 26 is connected between the source electrode of the amplification transistor 25 and each vertical signal line 9. When a drive signal supplied to a gate electrode via a signal line SEL becomes active, the selection transistor 26 becomes conductive in response to the active state, and outputs, to the vertical signal line 9, a pixel signal obtained in a sharing unit and output from the amplification transistor 25 while setting the sharing unit as a selected state. A plurality of pixels 2 in one sharing unit can output a pixel signal per pixel in accordance with a drive signal from the vertical drive circuit 4 or can simultaneously output a pixel signal per a plurality of pixels.

Figure 3:
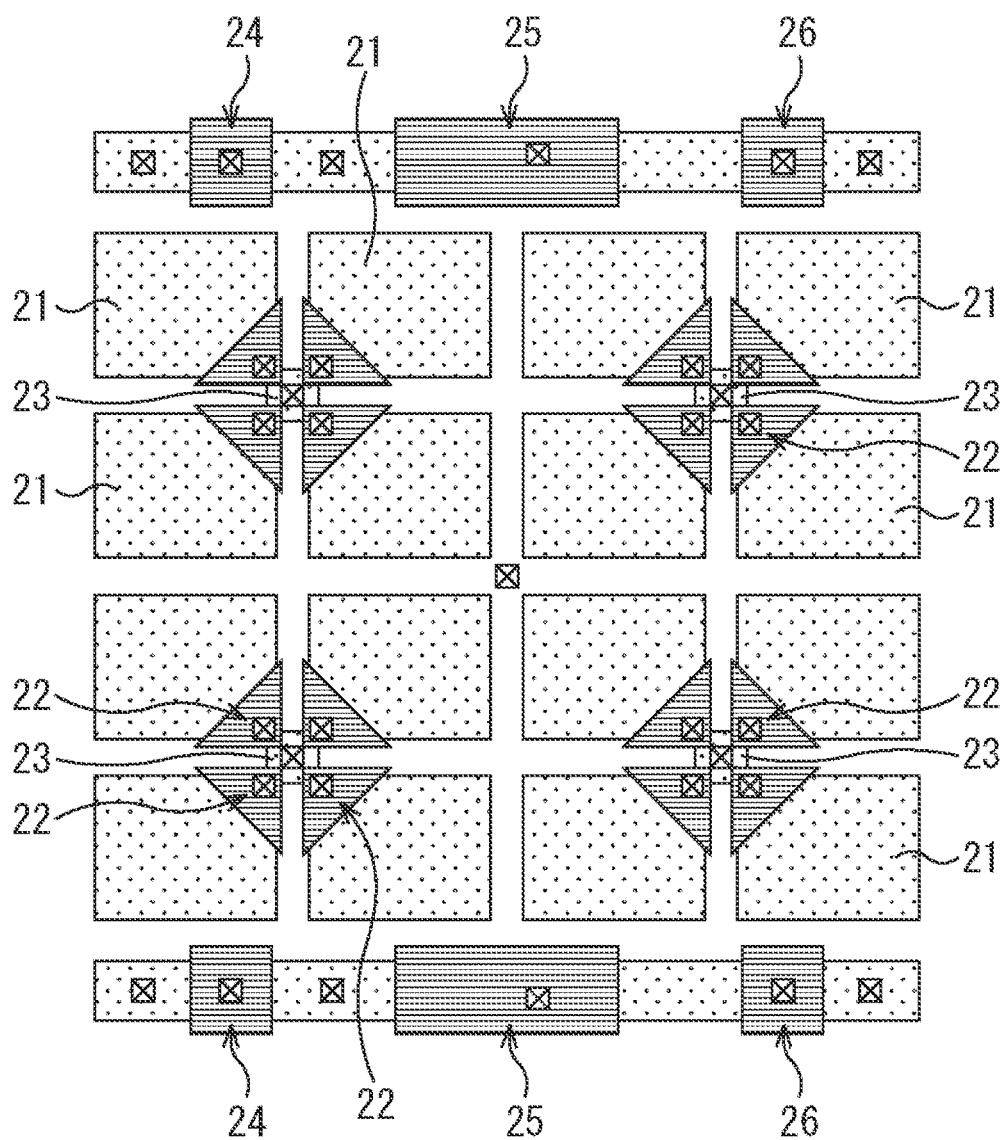
FIG. 3 is a diagram illustrating a pixel layout of the solid-state imaging device in FIG. 1.

FIG. 3 illustrates a pixel layout on the semiconductor substrate 12 of the photodiodes 21, transfer transistors 22, FDs 23, reset transistor 24, amplification transistor 25, and selection transistor 26 illustrated in FIG. 2. In FIG. 3, a portion corresponding to that in FIG. 2 is denoted by a same reference sign.

Figure 4:
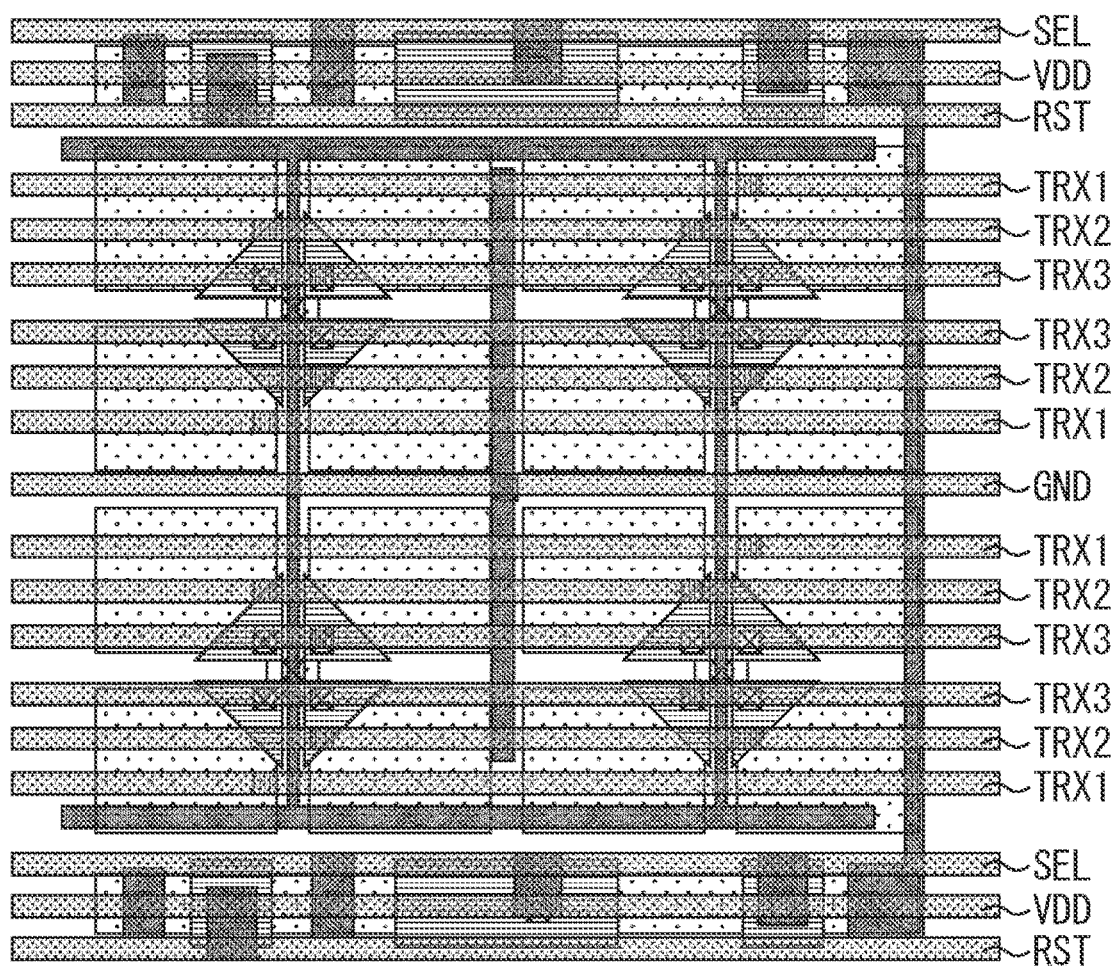
FIG. 4 is a diagram illustrating a wiring layout of the solid-state imaging device in FIG. 1.

Additionally, FIG. 4 illustrates a wiring layout of: the signal lines TRX1 to TRX3, SEL, and RST to transmit drive signals to control the pixel transistors (the transfer transistors 22, reset transistor 24, amplification transistor 25, and selection transistor 26) illustrated in FIG. 2; a power supply wire VDD; and a ground wire GND.

A pixel layout of the pixel array unit 3 has a layout as illustrated in FIG. 3 in which an FD 23 used in a sharing manner by four photodiodes 21 including two in the vertical direction and two in the lateral direction is arranged in a center portion thereof, and a transfer transistor 22 is arranged between the FD 23 and each photodiode 21.

Under a region where the sixteen photodiodes 21 including an array including four in the vertical direction and four in the lateral direction, arranged are the reset transistor 24, amplification transistor 25, and selection transistor 26 used in a sharing manner for the sixteen photodiodes 21 and the four FDs 23. Meanwhile, in FIGS. 3 and 4, the reset transistor 24, amplification transistor 25, and selection transistor 26 arranged above the region formed with the sixteen photodiodes 21 are pixel transistors used for other photodiodes 21 and FDs 23 (not illustrated).

Figure 5:
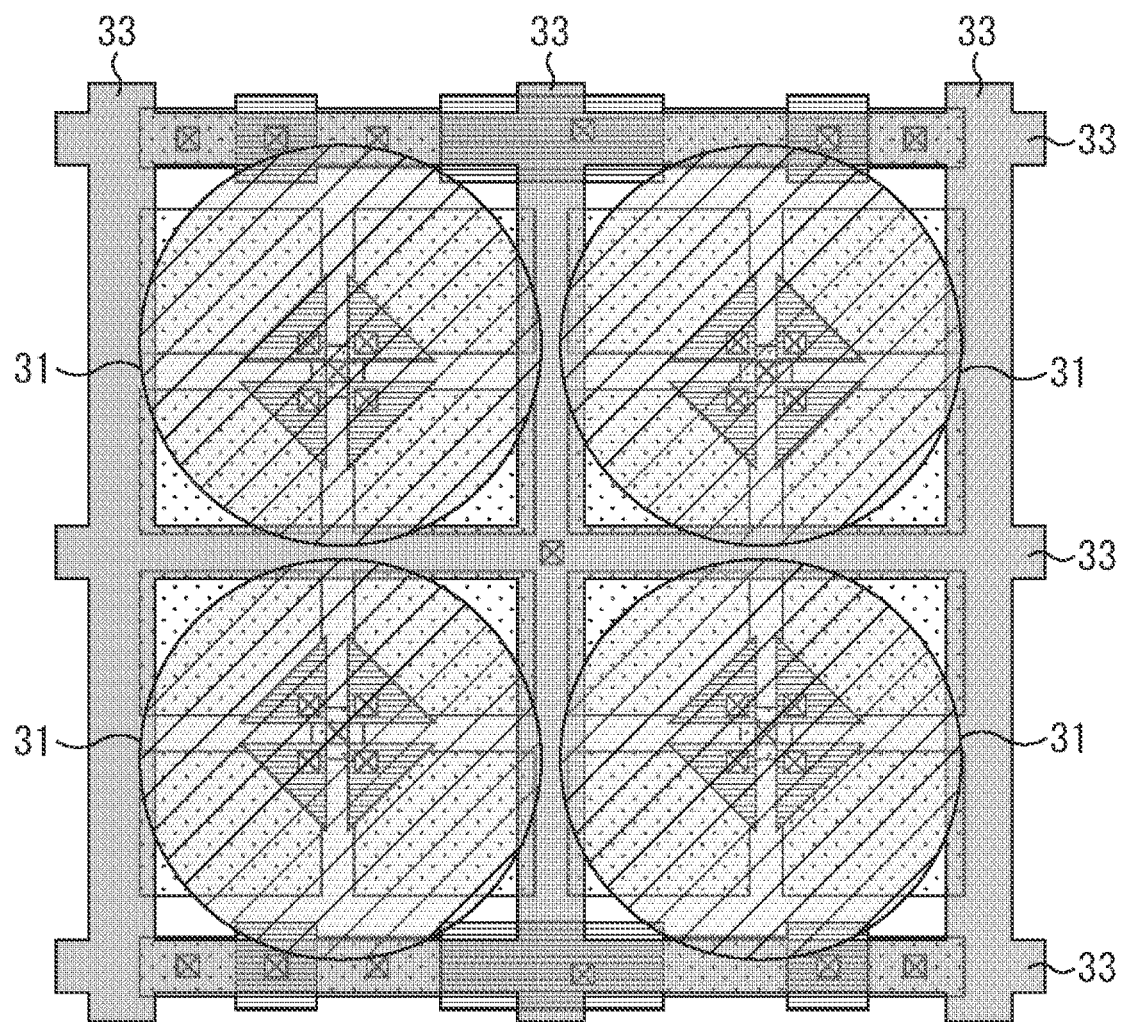
FIG. 5 is a diagram illustrating a layout of on-chip lenses and inter-pixel light shielding films.

FIG. 5 is a diagram in which on-chip lenses 31 and inter-pixel light shielding films 33 formed more on a light incidence side than photodiodes 21 in respective pixels 2 are illustrated in a manner superimposed on the pixel layout of FIG. 3.

Figure 6:
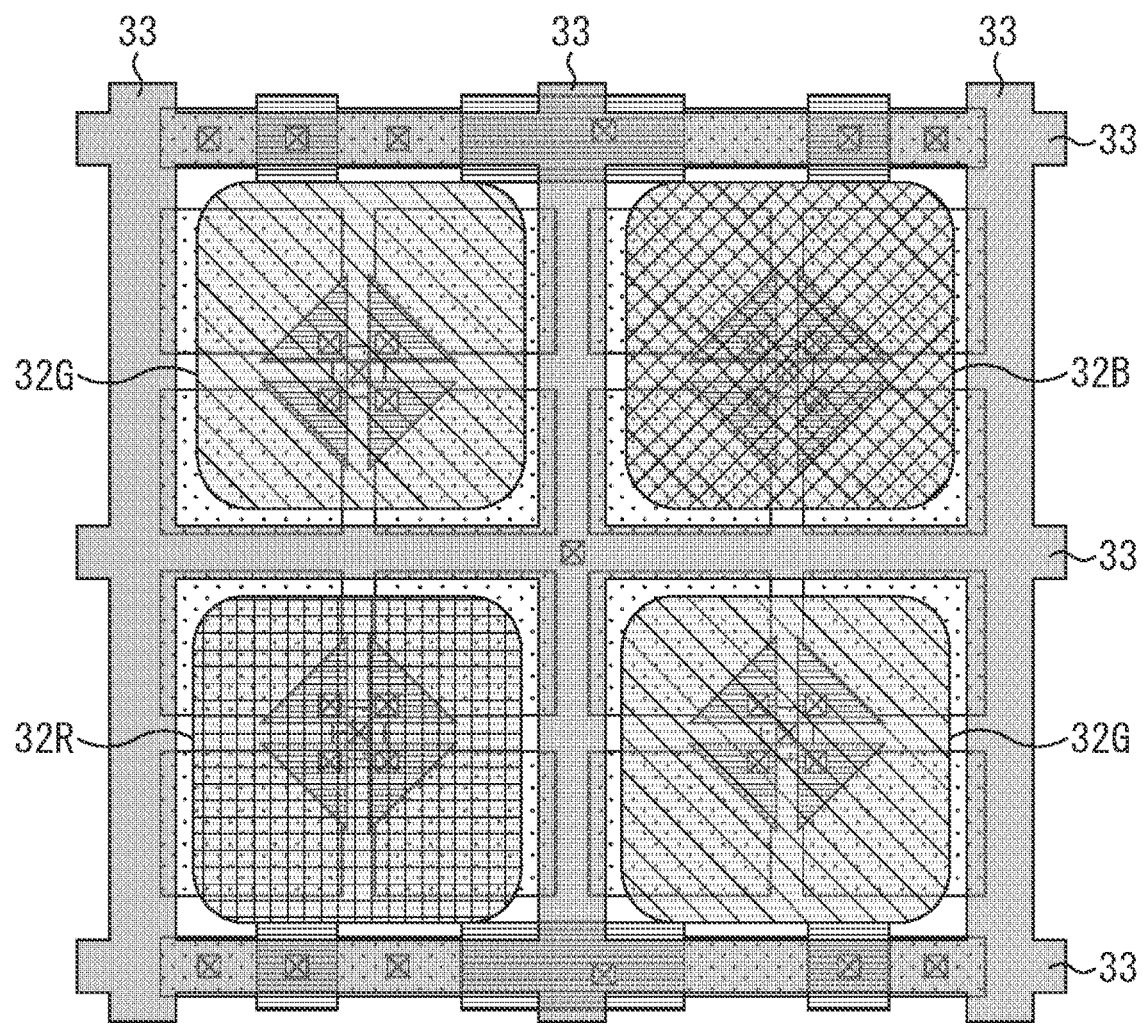
FIG. 6 is a diagram illustrating a layout of color filters.

Additionally, FIG. 6 is a diagram in which color filters 32 and the inter-pixel light shielding films 33 formed more on the light incidence side than the photodiodes 21 in the respective pixels 2 are illustrated in a manner superimposed on the pixel layout of FIG. 3. Note that a color filter 32 is arranged between photodiodes 21 and an on-chip lens 31.

Each on-chip lens 31 is formed in a manner such that one on-chip lens 31 is arranged on four photodiodes 21 (four pixels) including two in the vertical direction and two in the lateral direction.

As for a color filter 32 also, similar to the on-chip lens 31, a color filter 32 of one color (same color) is formed on four photodiodes 21 (four pixels) including two in the vertical direction and two in the lateral direction. In the example of FIG. 6, a color filter 32G transmitting G (green) light is formed on upper left four pixels, a color filter 32B transmitting B (blue) light is formed on upper right four pixels, a color filter 32R transmitting R (red) is formed on lower left four pixels, and a color filter 32G transmitting the G light is formed on lower right four pixels, thereby forming a Bayer array including four-pixel units.

The inter-pixel light shielding films 33 are formed in a grid pattern in the vertical direction and the lateral direction such that an on-chip lens 31 and a color filter 32 arranged per four pixels are separated from each other.

Figure 7:
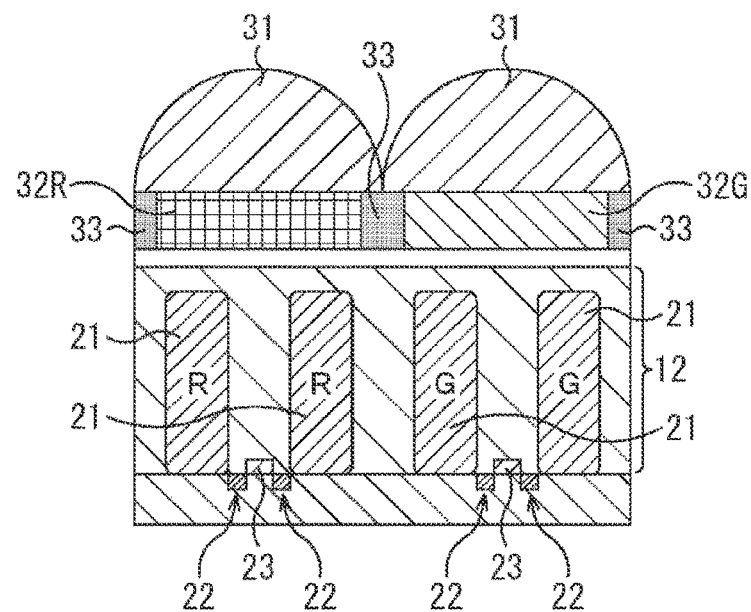
FIG. 7 is a cross-sectional view illustrating a pixel structure of a first embodiment.

The pixel structure of the first embodiment of the solid-state imaging device 1 in a cross-sectional view is illustrated in FIG. 7, for example.

In the first embodiment, a plurality of photodiodes 21 is formed under one on-chip lens 31, and the plurality of photodiodes 21 photoelectrically converts light of a same color via a color filter 32 of the same color arranged under the on-chip lens 31. In the example of FIG. 7, the plurality of photodiodes 21 under an on-chip lens 31 on an right side photoelectrically converts G light. The plurality of photodiodes 21 under an on-chip lens 31 on a left side photoelectrically converts R light. The inter-pixel light shielding film 33 is not formed in a separating region between pixels receiving light of the same color. An FD 23 is arranged at a center of the plurality of photodiodes 21 located under the same on-chip lens 31, and a transfer transistor 22 is arranged between the FD 23 and each of photodiodes 21.

In the solid-state imaging device 1 having the above-described configuration, since a plurality of photodiodes 21 is formed under one on-chip lens 31, an image surface phase difference autofocus function can be achieved on the basis of pixel signals of respective pixels 2 that can be acquired in one frame.

Additionally, an HDR function to generate a high dynamic range image can also be achieved by setting different exposure times for a plurality of pixels under one on-chip lens 31.

First Operation Mode

A first operation mode that can be executed by the solid-state imaging device 1 will be described with reference to FIGS. 8 and 9.

The first operation mode that can be executed by the solid-state imaging device 1 is an operation mode in which the image surface phase difference autofocus function and the HDR function are achieved at the same time on the basis of pixel signals of respective pixels 2 that can be acquired in one frame.

The image surface phase difference autofocus function can be achieved by comparing, as phase difference signals, pixel signals acquired from two pixels symmetrically arranged with respect to an optical axis out of a plurality of pixels formed under one on-chip lens 31. In other words, the pixel signals of the two pixels symmetrically arranged with respect to the optical axis are deviated from each other due to difference in arrangement of a light receiving region with respect to the optical axis. A defocus amount is calculated on the basis of a phase deviation amount between the two pixel signals, and autofocus can be achieving by adjusting (moving) a photographing lens.

For example, in the pixel layout of FIG. 2, pixel signals of an upper right photodiode 21 and a lower left photodiode 21 are acquired as phase difference signals from among the four pixels sharing one FD 23, and then a phase difference is detected. Additionally, pixel signals of an upper left photodiode 21 and a lower right photodiode 21 are acquired as phase difference signals, and then a phase difference is detected.

The HDR function can be achieved by setting an exposure time for a plurality of pixels formed under one on-chip lens 31 to any one of a first exposure time (hereinafter also referred to as a long animal time) and a second exposure time shorter than the same (hereinafter also referred to as a short animal time), and combining a long animal pixel signal acquired from a pixel 2 for which the long animal time is set and a short animal pixel signal acquired from a pixel 2 for which the short animal time is set.

Figure 8:
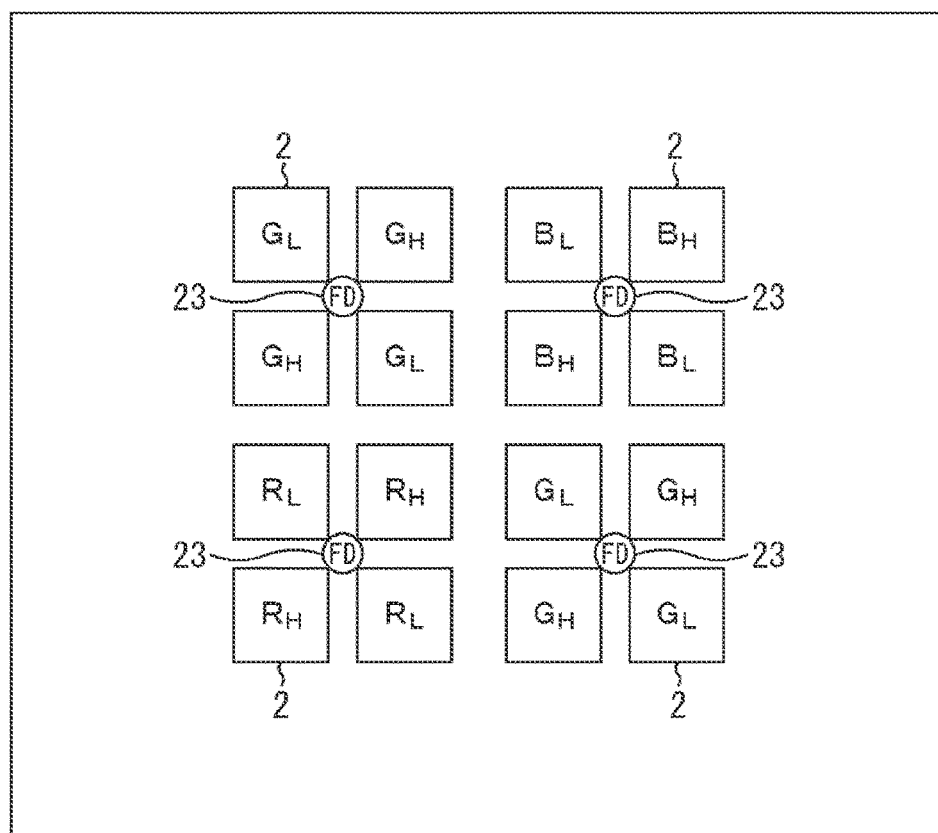
FIG. 8 is a diagram illustrating a first operation mode.

FIG. 8 illustrates exemplary setting of exposure time for each pixel in the first operation mode.

In FIG. 8, a pixel 2 indicated as $G_H$ represents a G pixel where a G color filter 32G is arranged, that is, a pixel having an exposure time set to the long animal time, and a pixel 2 indicated as $G_L$ represents G pixel, that is, a pixel having an exposure time set to the short animal time.

Additionally, in FIG. 8, a pixel 2 indicated as $B_H$ represents a B pixel where a B color filter 32B is arranged, that is, a pixel having an exposure time is set to the long animal time, and a pixel 2 indicated as $B_L$ represents a B pixel, that is, a pixel having an exposure time set to the short animal time.

Similarly, a pixel 2 indicated as $R_H$ represents a R pixel where an R color filter 32R is arranged, that is, a pixel having an exposure time set to the long animal time, and a pixel 2 indicated as $R_L$ represents an R pixel, that is, a pixel having an exposure time set to the short animal time.

According to the equivalent circuit diagram illustrated in FIG. 2, the first operation mode of FIG. 8 can be achieved by: setting, to the short animal time, an exposure time for a pixel 2 including a transfer transistor 22 connected to a signal line TRX2 in each of the first row to the fourth row, and also setting an exposure time, to the long animal time, for a pixel 2 including a transfer transistor 22 connected to signal lines TRX1 and TRX3 out of the total sixteen pixels including four pixels in the vertical direction and four pixels in the lateral direction.

Figure 9:
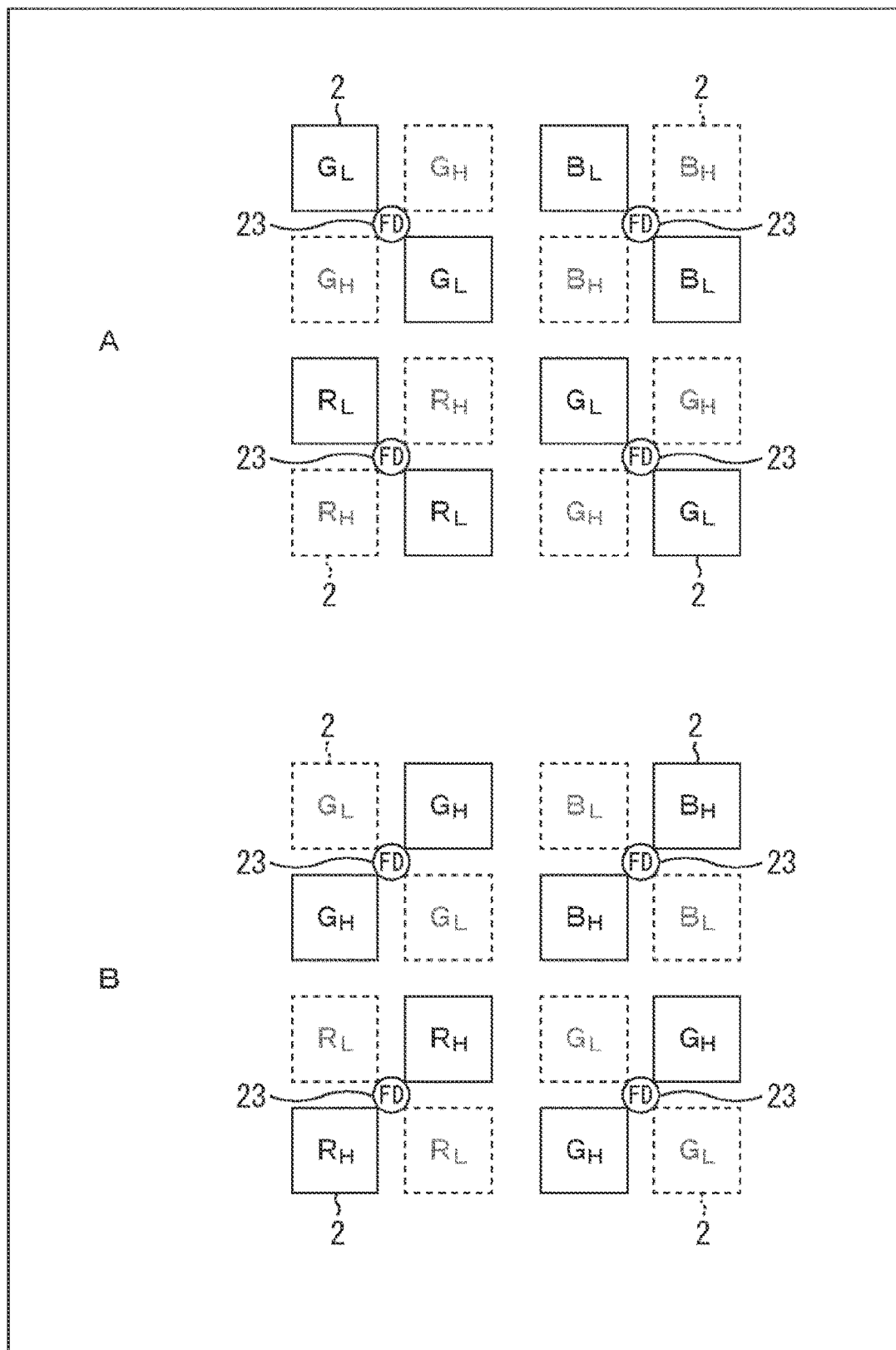
FIG. 9 is a diagram illustrating the first operation mode.

In this first operation mode, as illustrated in A of FIG. 9, both of pixels 2 arranged respectively at an upper left and a lower right (in a left oblique direction) centering the FD 23 have an exposure time set to the short animal time, and pixel signals thereof can be used as short animal pixel signals at the time of implementing the HDR function.

Additionally, the pixels 2 arranged at the upper left and the lower right centering the FD 23 are set to have the same exposure time, and these are the pixels in which light receiving regions (photodiodes 21) are symmetrically arranged with respect to an optical axis, and therefore, the short animal pixel signals of these two pixels can be used as phase difference signals.

Additionally, as illustrated in B of FIG. 9, both of pixels 2 arranged respectively at an upper right and a lower left (in a right oblique direction) centering the FD 23 have an exposure time set to the long animal time, and pixel signals thereof can be used as long animal pixel signals at the time of implementing the HDR function.

Additionally, the pixels 2 arranged at the upper right and the lower left centering the FD 23 are set to have the same exposure time, and these are the pixels in which light receiving regions (photodiodes 21) are arranged symmetrically with respect to the optical axis, and therefore, the long animal pixel signals of these two pixels can be used as phase difference signals.

Therefore, according to the first operation mode of the solid-state imaging device 1, the image surface phase difference autofocus function and the HDR function can be achieved at the same time, and a signal to detect a phase difference and a signal to generate a high dynamic range image can be acquired at the same time.

Second Operation Mode

Next, second operation mode that can be executed by the solid-state imaging device 1 will be described with reference to FIGS. 10 and 11.

The second operation mode that can be executed by the solid-state imaging device 1 is an operation mode whereby all of pixels are set to a have a same exposure time; and phase difference detection accuracy of the image surface phase difference autofocus function is improved.

Figure 10:
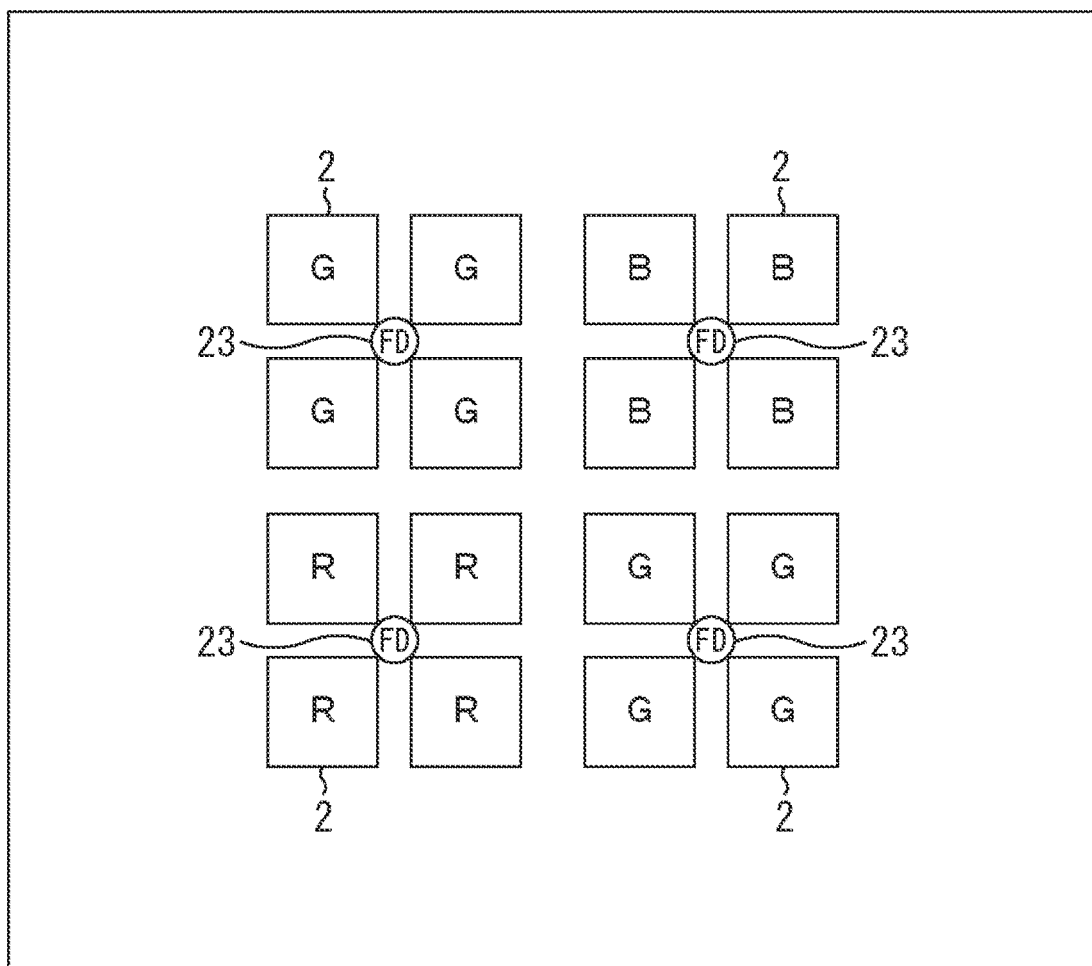
FIG. 10 is a diagram illustrating a second operation mode.

In the second operation mode, since all of the pixels are set to have the same exposure time, a G pixel signal is output from a pixel 2 where a G color filter 32G is arranged, a B pixel signal is output from a pixel 2 where a B color filter 32B is arranged, and an R pixel signal is output from a pixel 2 where an R color filter 32R is arranged as illustrated in FIG. 10.

Figure 11:
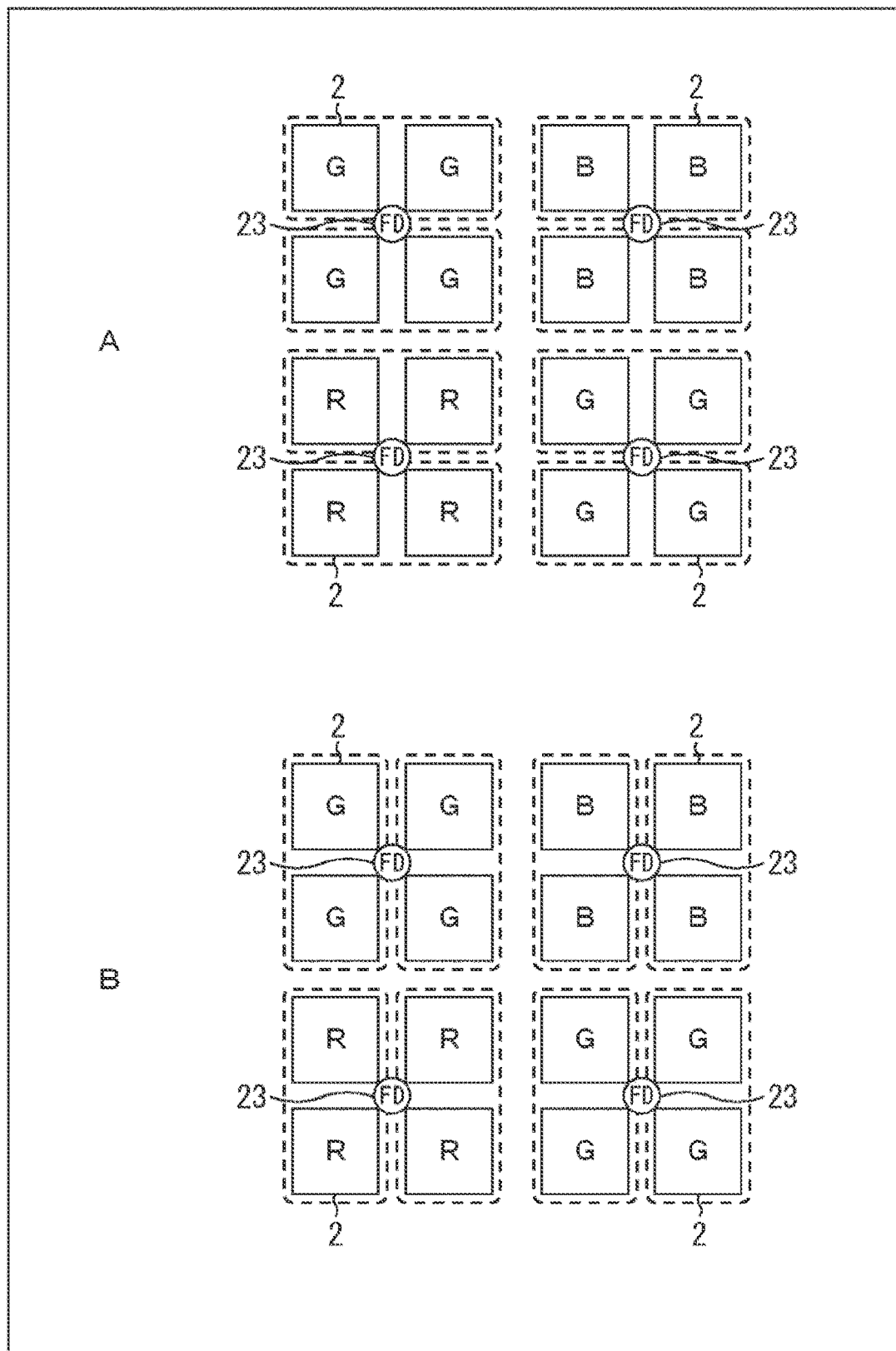
FIG. 11 is a diagram illustrating the second operation mode.

As a result, as indicated by broken lines in A of FIG. 11, upper two pixels and lower two pixels centering an FD 23 are two pixel regions where light receiving regions are symmetrically arranged with respect to an optical axis, and therefore, pixel signals of these two pixel regions can be used as phase difference signals.

Additionally, as indicated by broken lines in B of FIG. 11, right two pixels and left two pixels centering an FD 23 are two pixel regions where light receiving regions are symmetrically arranged with respect to an optical axis, and therefore, pixel signals of these two pixel regions can be used as phase difference signals.

Furthermore, similar to the first operation mode, pixel signals of two pixels 2 arranged at the upper left and the lower right (in the left oblique direction) centering an FD 23 and pixels signals of two pixels 2 arranged at the upper right and the lower left (in the right oblique direction) centering an FD 23 can also be used as phase difference signals while using a pixel signal of each pixel.

When a phase difference signal that can be acquired in the second operation mode is compared with a phase difference signal that can be acquired in the first operation mode, a signal amount of the phase difference signal to be compared is twice that in the first operation mode in a case of detecting a phase difference by using an added signal obtained by adding pixel signals of two pixels.

Additionally, while detecting directions to detect a phase difference are two directions including the left oblique direction and the right oblique direction in the first operation mode, detecting directions to detect a phase difference are four directions including the left oblique direction, right oblique direction, vertical direction, and lateral direction in the second operation mode.

Therefore, according to the second operation mode, an information amount to detect a phase difference is twice that in the first operation mode, and the phase difference detection accuracy can be improved.

Meanwhile, in a case of detecting a phase difference only in one of the vertical direction and the lateral direction, pixel signals of two pixels to be added are transferred to an FD 23 at the same time, and can be output after being added at the FD 23. For example, in a case of detecting a phase difference in the vertical direction, pixel signals of upper two pixels are output after being added at the FD 23, and also pixel signals of lower two pixels are output after being added at the FD 23. In a case of detecting a phase difference in the lateral direction, pixel signals of right two pixels are output after being added at the FD 23, and pixel signals of left two pixels are output after being added at the FD 23. The order of pixel outputting of the upper two pixels and the lower two pixels and the order of pixel outputting of the right two pixels and the left two pixels may be reversed.

Modified Example of Color Filter

In the example described above, the description has been provided assuming that the color filters 32 has an array corresponding to a Bayer array including four-pixel units as illustrated in FIG. 6, but the array of the color filters 32 is not limited thereto.

Figure 12:
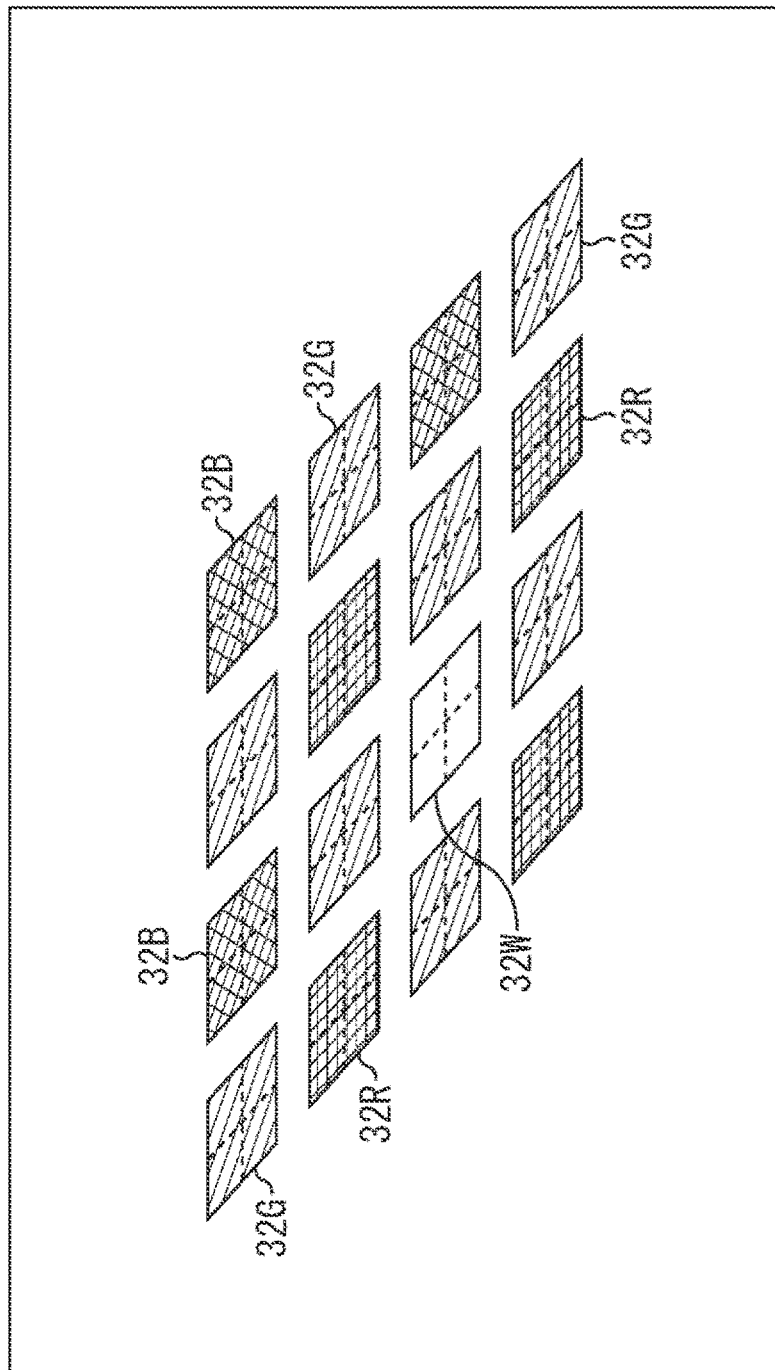
FIG. 12 is a diagram illustrating a modified example of color filters.

For example, as illustrated in FIG. 12, the array of the color filters 32 can be an array in which not only R, G, and B color filters 32 but also a white (W) color filter 32W transmitting light of any wavelength of the R, G, and B are arranged at predetermined positions in a manner providing one color filter for every four pixels. Additionally, a color (wavelength) of light transmitted by a color filter 32 are not limited to R, G, and B. For example, a color filter 32 that transmits light having wavelengths corresponding to complementary colors such as yellow (Ye), magenta (Mg), and cyan (Cy) may also be adopted.

Exemplary Setting for Phase Difference Detection Pixels

The first and second operation modes described above are the drive in which a plurality of pixels formed under one on-chip lens 31 is each controlled to have a predetermined exposure time and output a pixel signal of each pixel 2. The image surface phase difference autofocus function can be achieved by deeming pixel signals of corresponding two pixels as phase difference signals and calculating a phase difference, and therefore, which one of pixels 2 inside the pixel array unit 3 is set as a phase difference detection pixel is arbitrary. Therefore, which one of the pixel 2 inside the pixel array unit 3 is set as the phase difference detection pixel can be suitably determined in accordance with operation setting, imaging conditions, and the like.

Figure 13:
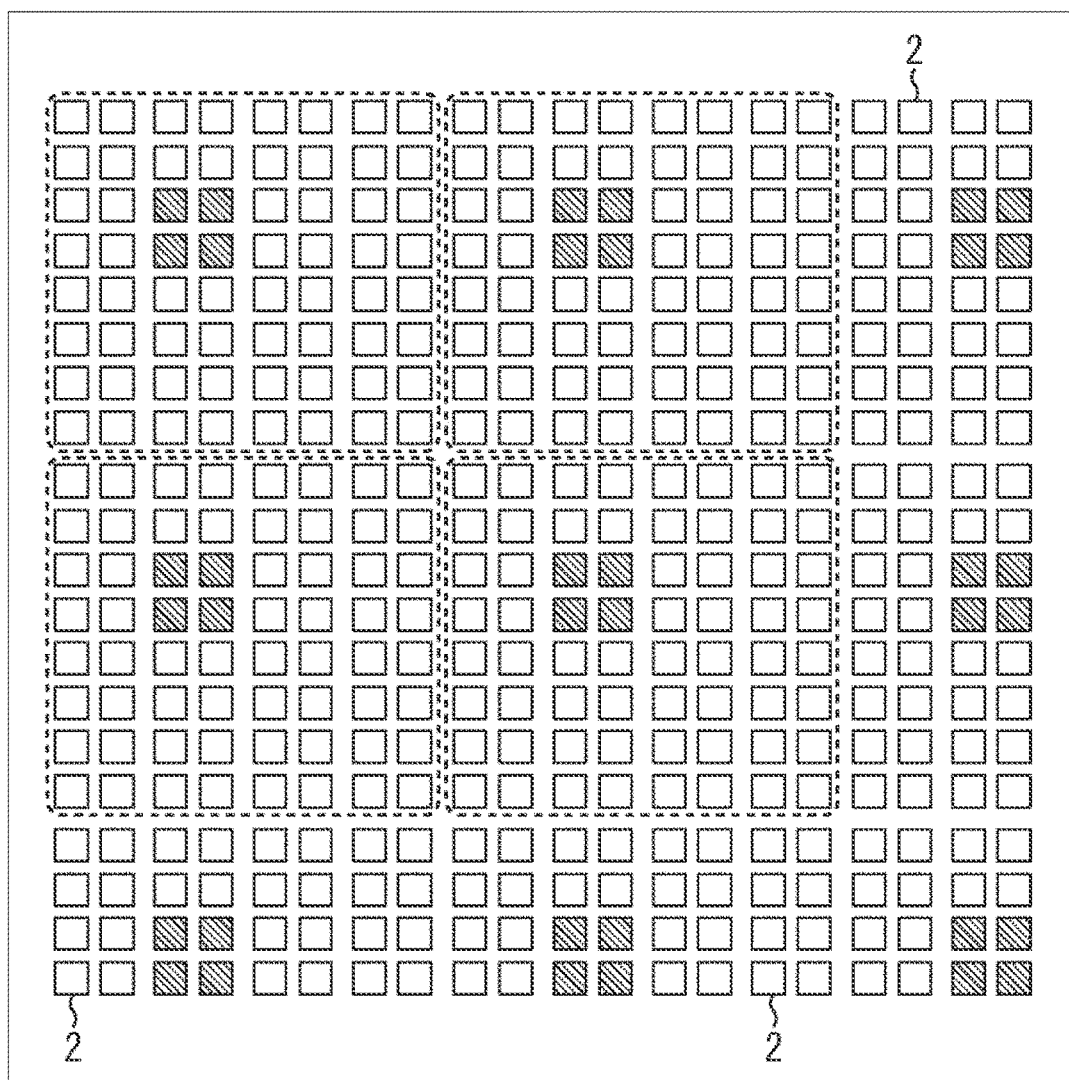
FIG. 13 is a diagram illustrating an exemplary setting for phase difference detection pixels.

For example, as illustrated in FIG. 13, only predetermined four pixels centering one certain FD 23 may be set as phase difference detection pixels to detect a phase difference for a region indicated by broken lines and having 64 pixels including eight in the vertical direction and eight in the lateral direction. In FIG. 13, hatched pixels 2 represent pixels set as phase difference detection pixels. In other words, FIG. 13 illustrates the example in which phase difference detection pixels are set at a pixel ratio of 4/64 in the pixel array unit 3.

Figure 14:
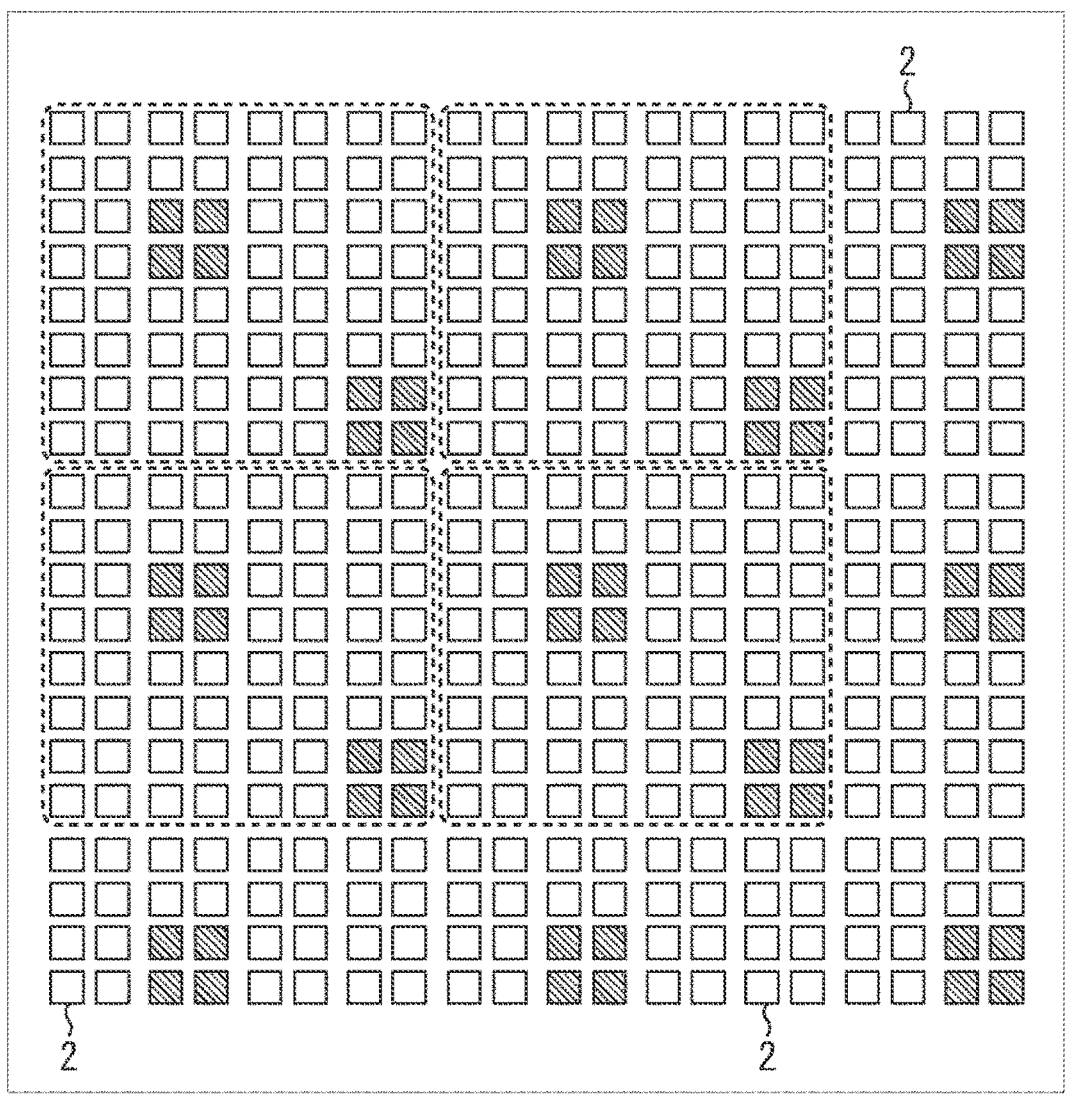
FIG. 14 is a diagram illustrating an exemplary setting for phase difference detection pixels.

Additionally, for example, only total eight pixels including predetermined four pixels centering one certain FD 23 and predetermined four pixels centering another FD 23 may also be set as phase difference detection pixels to detect a phase difference for a region indicated by broken lines and having 64 pixels including eight in the vertical direction and eight in the lateral direction as illustrated in FIG. 14. In other words, FIG. 14 illustrates the example in which the phase difference detection pixels are set at the ratio of 8/64 pixels in the pixel array unit 3.

Figure 15:
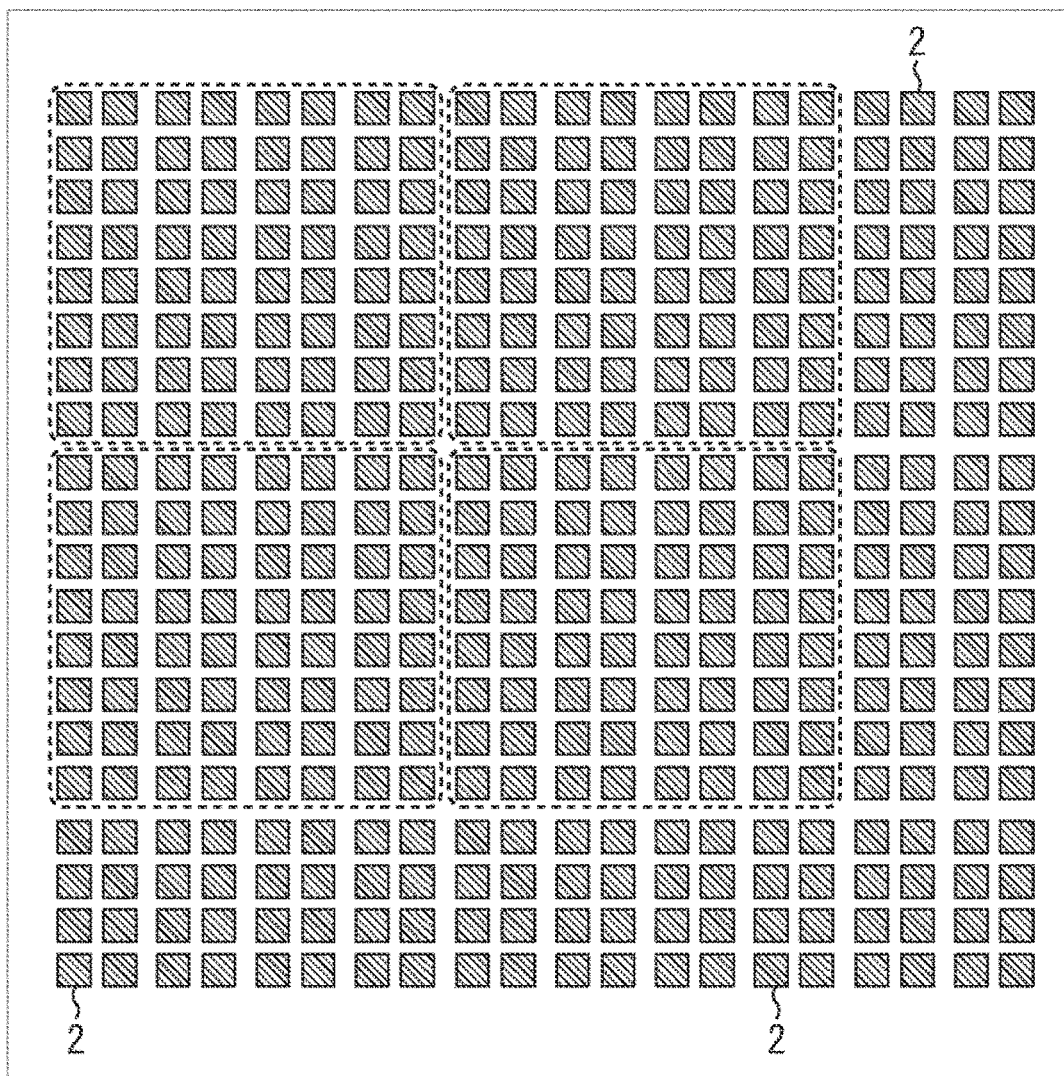
FIG. 15 is a diagram illustrating an exemplary setting for phase difference detection pixels.

Alternatively, as illustrated in FIG. 15, all of pixels of the pixel array unit 3 may be set as phase difference detection pixels to detect a phase difference. In other words, FIG. 15 illustrates the example in which all of the pixels of the pixel array unit 3 are set as the phase difference detection pixels.

Meanwhile, as described with reference to FIG. 12, since the array of the color filters 32 is also arbitrary, a color of a color filter 32 for a pixel 2 to be set as a phase difference detection pixel is also not limited and may be any color.

Different Examples of Pixel Structure

The present technology is not limited to the pixel structure illustrated in FIG. 7, and can be applied any kind of pixel structure that has a pixel layout as next: no inter-pixel light shielding film 33 is provided in a separating region between pixels that receive light of a same color; a plurality of pixels formed in an underlayer of one on-chip lens 31 and a color filter 32 of the same color shares an FD 23, a reset transistor 24, an amplification transistor 25, and a selection transistor 26; and at least two kinds of exposure times including a long animal time and a short animal time can be set.

In the following, other pixel structures to which the present technology can be applied will be described with reference to FIGS. 16 to 19. Note that, in FIGS. 16 to 19, a portion corresponding to that in the above-described embodiment is denoted by a same reference sign, and the description thereof will be suitably omitted.

First Different Pixel Structure

Figure 16:
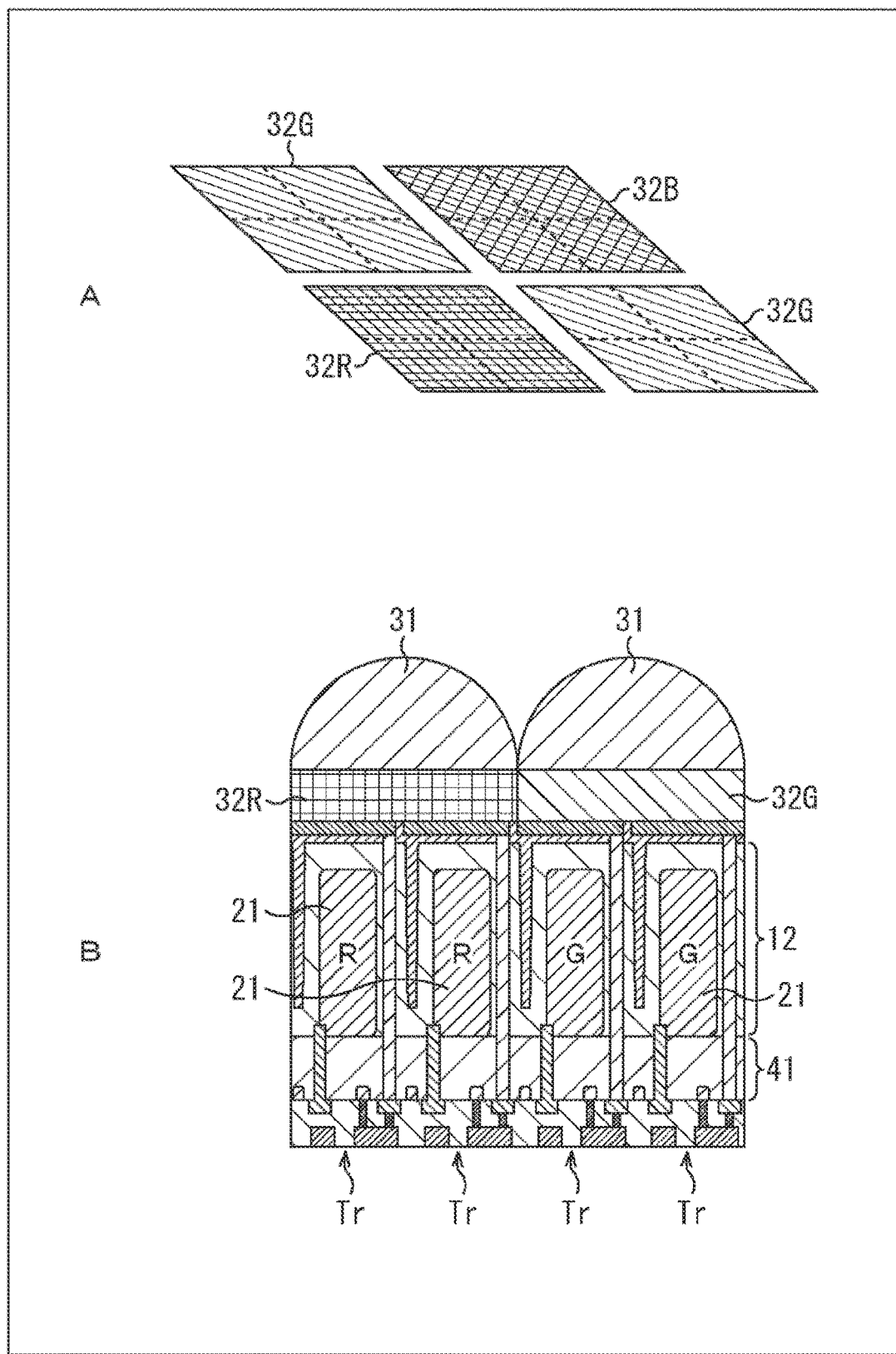
FIG. 16 is a diagram illustrating a first different pixel structure according to the first embodiment.

FIG. 16 is a diagram illustrating a first different pixel structure according to the first embodiment.

The first pixel structure illustrated in FIG. 16 has a pixel structure formed by stacking, in a depth direction: a transistor region where respective pixel transistors Tr including a transfer transistor 22, a reset transistor 24, an amplification transistor 25, and a selection transistor 26, and FDs 23 are formed; and a photodiode region where photodiodes 21 are formed.

A of FIG. 16 is a diagram illustrating an exemplary array of color filters 32 for sixteen pixels constituting one sharing unit. In the first different pixel structure, a Bayer array including four-pixel units is provided in a manner similar to FIG. 6.

B of FIG. 16 illustrates a cross-sectional view of pixels 2 in the first different pixel structure.

In the first different pixel structure, an epitaxial layer 41 deposited by epitaxial growth is formed on a lower surface (surface opposite to a surface where an on-chip lens 31 is formed) of a semiconductor substrate 12 on which photodiodes 21 are formed as illustrated in B of FIG. 16. Additionally, respective pixel transistors Tr including the transfer transistor 22, reset transistor 24, amplification transistor 25, and selection transistor 26 are formed on a surface of the epitaxial layer 41 located opposite to the surface where the photodiode 21 are formed. Since a transistor region where the pixel transistors Tr are formed and a photodiode region where the photodiodes 21 are formed are arranged in a manner stacked in the depth direction as described above, an arrangement area in a plane direction can be reduced, and a pixel area can be downsized.

In this pixel structure also, the image surface phase difference autofocus function and the HDR function can be achieved at the same time, and a signal to detect a phase difference and a signal to generate a high dynamic range image can be acquired at the same time by: forming the pixel circuit inside a region including sixteen pixels constituting one sharing unit as illustrated in FIG. 2; and performing the drive in the first operation mode.

Additionally, the image surface phase difference autofocus function with improved phase difference detection accuracy can be achieved by performing the drive in the second operation mode.

Second Different Pixel Structure

Figure 17:
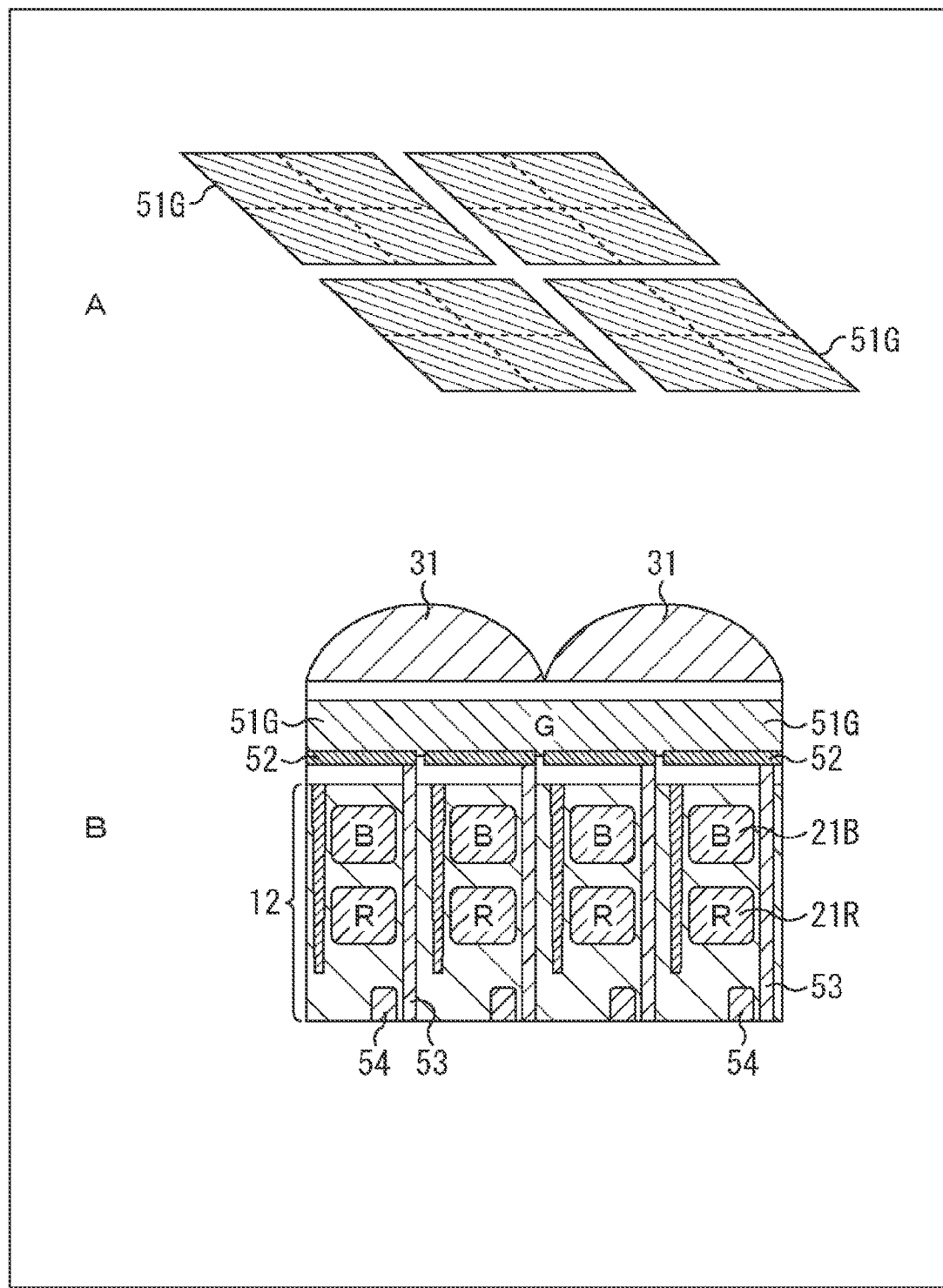
FIG. 17 is a diagram illustrating a second different pixel structure according to the first embodiment.

FIG. 17 is a diagram illustrating a second different pixel structure according to the first embodiment.

The second different pixel structure illustrated in FIG. 17 is a pixel structure including three photoelectric conversion units in the depth direction of the semiconductor substrate 12. Specifically, a photoelectric conversion film 51G that photoelectrically converts G light is formed on an upper surface of the semiconductor substrate 12 as a first photoelectric conversion unit, and photodiodes 21B and 21R formed by P-N junction are formed as second and third photoelectric conversion units in a manner stacked in the depth direction inside the semiconductor substrate 12.

A of FIG. 17 is a diagram illustrating arrangement of the photoelectric conversion films 51G formed on the upper surface of the semiconductor substrate 12.

As the photoelectric conversion film 51G that photoelectrically converts the G light, for example, an organic photoelectric conversion material containing a rhodamine-based dye, a merocyanine-based dye, quinacridone, and or the like can be used.

B in FIG. 17 illustrates a cross-sectional view of pixels 2 in the second different pixel structure.

As for the photodiodes 21B and 21R, the photodiode 21B photoelectrically converts B light and the photodiode 21R photoelectrically converts R light depending on a difference in the depth position formed with the P-N junction. Not only the photoelectric conversion film 51G but also a pixel electrode 52 individually formed in each pixel are formed on the upper surface side (light incident side) of the semiconductor substrate 12.

Electric charge photoelectrically converted by the photoelectric conversion film 51G is accumulated in a diffusion layer 54 inside the semiconductor substrate 12 from the pixel electrode 52 individually formed in each pixel via a metal wire 53. The electric charge accumulated in the diffusion layer 54 is output to a column signal processing circuit 5 by a pixel transistor (not illustrated) in a manner similar to the above-described embodiment.

In the pixel structure in which the three photoelectric conversion units that photoelectrically convert light of different colors are stacked as described above also, the image surface phase difference autofocus function and the HDR function can be achieved at the same time, and a signal to detect a phase difference and a signal to generate a high dynamic range image can be acquired at the same time by: forming the pixel circuit inside the region including sixteen pixels constituting one sharing unit as illustrated in FIG. 2; and performing the drive in the first operation mode.

Additionally, the image surface phase difference autofocus function with improved phase difference detection accuracy can be achieved by performing the drive in the second operation mode.

Third Different Pixel Structure

Figure 18:
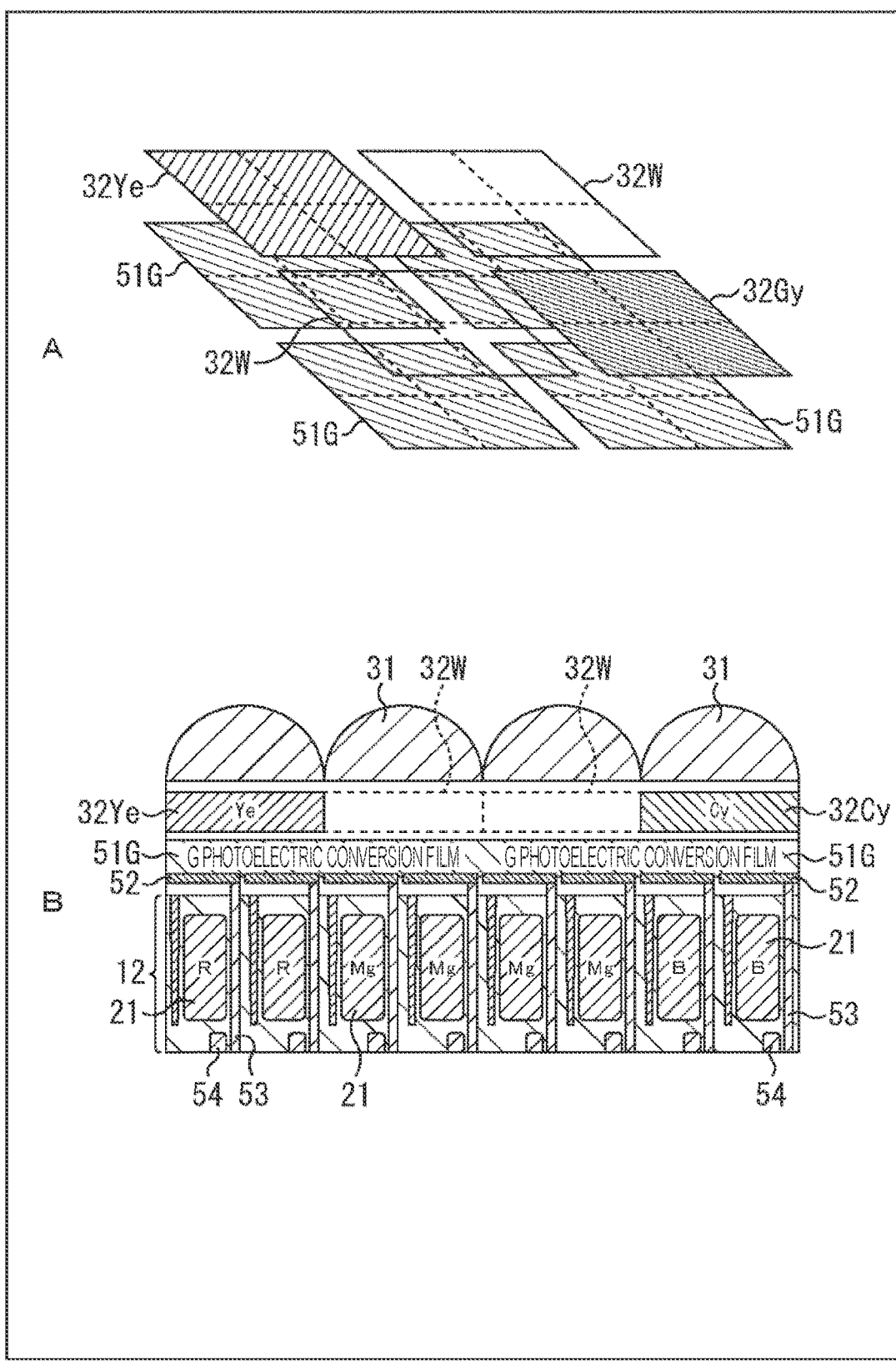
FIG. 18 is a diagram illustrating a third different pixel structure according to the first embodiment.

FIG. 18 is a diagram illustrating a third different pixel structure according to the first embodiment. In FIG. 18 also, a portion corresponding to that in FIGS. 16 and 17 is denoted by a same reference sign, and the description thereof will be suitably omitted.

The third different pixel structure illustrated in FIG. 18 is a pixel structure in which a photoelectric conversion unit includes both of: photodiodes 21 formed by P-N junction inside the semiconductor substrate 12; and photoelectric conversion films 51 formed on the upper surface side (light incident side) of the semiconductor substrate 12.

A of FIG. 18 illustrates arrangement of color filters 32 and the photoelectric conversion films 51 formed on the upper surface of the semiconductor substrate 12.

B of FIG. 18 illustrates a cross-sectional view of pixels 2 in the third different pixel structure. Note that eight pixels including two in the vertical direction and four in the lateral direction are deemed as a unit in B of FIG. 18, and A of FIG. 18 illustrates that an array in the vertical direction is changed to an array in the lateral direction is changed.

As color filters 32 of the third different pixel structure, a color filter 32Ye that transmits yellow (Ye) light, a white (W)

color filter 32W, a W color filter 32W, and a color filter 32Cy that transmits cyan (Cy) light are formed in a manner respectively corresponding to four on-chip lenses 31. The W color filter 32W can include, for example, a resin material such as a styrene resin, an acrylic resin, a styrene-acrylic copolymer resin, or a siloxane resin, or can include a material same as the on-chip lens 31 by using an inorganic material such as a nitride film (SiN), an oxynitride film (SiON), or a silicon carbide (SiC).

As a photoelectric conversion film 51, a photoelectric conversion film 51G that photoelectrically converts G light is formed in each of sixteen pixels constituting one sharing unit.

As illustrated in B of FIG. 18, electric charge obtained by photoelectrically converting R light is accumulated in a photodiode 21 formed under the Ye color filters 32Ye and the G photoelectric conversion film 51G out of photodiodes 21 formed inside the semiconductor substrate 12.

Electric charge obtained by photoelectrically converting magenta (Mg) light is accumulated in a photodiode 21 formed under the W color filter 32W and the G photoelectric conversion film 51G.

Electric charge obtained by photoelectrically converting B light is accumulated in a photodiodes 21 formed under the Cy color filter 32Cy and the G photoelectric conversion film 51G.

In this pixel structure also, the image surface phase difference autofocus function and the HDR function can be achieved at the same time, and a signal to detect a phase difference and a signal to generate a high dynamic range image can be acquired at the same time by: forming the pixel circuit inside a region including sixteen pixels constituting one sharing unit as illustrated in FIG. 2; and performing the drive in the first operation mode.

Additionally, the image surface phase difference autofocus function with improved phase difference detection accuracy can be achieved by performing the drive in the second operation mode.

Fourth Different Pixel Structure

Figure 19:
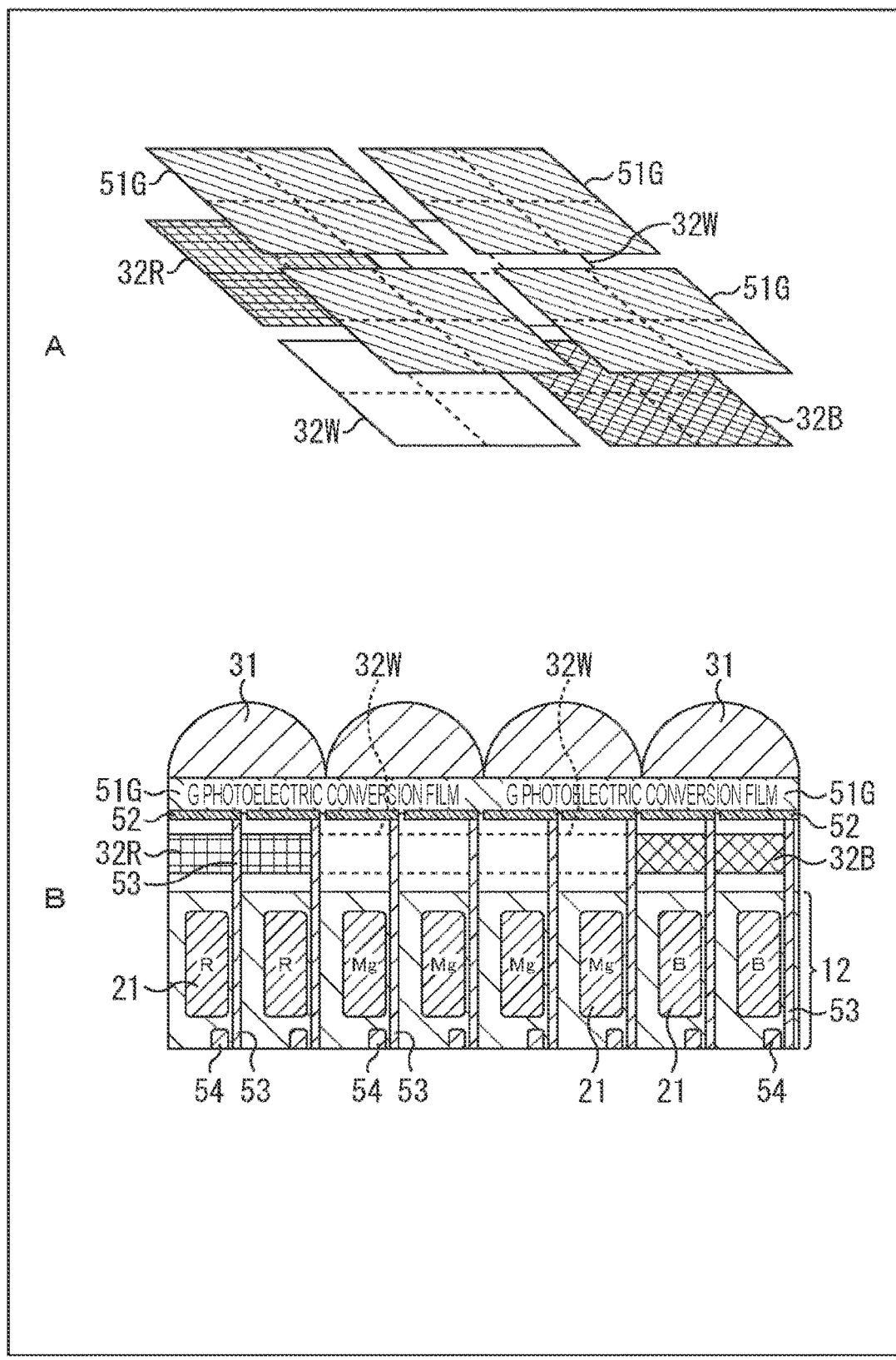
FIG. 19 is a diagram illustrating a fourth different pixel structure according to the first embodiment.

FIG. 19 is a diagram illustrating a fourth different pixel structure according to the first embodiment. In FIG. 19 also, a portion corresponding to that in FIGS. 16 to 18 is denoted by a same reference sign, and the description thereof will be suitably omitted.

The fourth pixel structure illustrated in FIG. 19 is a pixel structure in which a photoelectric conversion unit includes both of: a photodiodes 21 formed by P-N junction inside the semiconductor substrate 12; and photoelectric conversion films 51 formed on the upper surface side (light incident side) of the semiconductor substrate 12.

Note that a point that the fourth different pixel structure differs from the third different pixel structure illustrated in FIG. 18 in that the fourth different pixel structure has a vertical stacking structure of two layers including a photoelectric conversion film 51 and a color filter 32 of a primary color while the third different pixel structure has a vertical stacking structure of two layers including a photoelectric conversion film 51 and a color filter 32 of a complementary color.

A of FIG. 19 illustrates arrangement of color filters 32 and photoelectric conversion films 51 formed on the upper surface of the semiconductor substrate 12.

B of FIG. 19 illustrates a cross-sectional view of pixels 2 in the fourth different pixel structure. Note that eight pixels including two in the vertical direction and four in the lateral direction are also deemed as a unit in B of FIG. 19, and A of FIG. 19 illustrates that an array in the vertical direction is changed to an array in the lateral direction.

As color filters 32 of the fourth pixel structure, a color filter 32R that transmits R light, a W color filter 32W, a W color filter 32W, and a B color filter 32B are formed in a manner corresponding to four on-chip lenses 31.

Additionally, as a photoelectric conversion film 51, a photoelectric conversion film 51G that photoelectrically converts G light is formed in each of sixteen pixels constituting one sharing unit.

In the third pixel structure using a color filter 32 of a complementary color illustrated in FIG. 18, the G photoelectric conversion film 51G is arranged under the color filter 32, but in the fourth pixel structure using a color filter 32 of a primary color, the G photoelectric conversion film 51G is arranged on an upper layer of the color filter 32

As illustrated in B of FIG. 19, electric charge obtained by photoelectrically converting R light is accumulated in a photodiode 21 formed under the G photoelectric conversion film 51G and the R color filters 32R out of photodiodes 21 formed inside the semiconductor substrate 12.

Electric charge obtained by photoelectrically converting magenta (Mg) light is accumulated in a photodiodes 21 formed under the G photoelectric conversion film 51G and the W color filter 32W.

Electric charge obtained by photoelectrically converting B light is accumulated in a photodiodes 21 formed under the G photoelectric conversion film 51G and the B color filter 32B.

In this pixel structure also, the image surface phase difference autofocus function and the HDR function can be achieved at the same time, and a signal to detect a phase difference and a signal to generate a high dynamic range image can be acquired at the same time by: forming the pixel circuit inside a region including sixteen pixels constituting one sharing unit as illustrated in FIG. 2; and performing the drive in the first operation mode.

Additionally, the image surface phase difference autofocus function with improved phase difference detection accuracy can be achieved by performing the drive in the second operation mode.

Modified Example of Number in One Sharing Unit

In the above examples, a reset transistor 24, an amplification transistor 25, and a selection transistor 26 are shared by sixteen pixels, but the number of pixels sharing the reset transistor 24, amplification transistor 25, and selection transistor 26 is not limited to sixteen. For example, like FDs 23, one sharing unit may include four pixels or may include eight pixels including two in the vertical direction and four in the lateral direction or four in the vertical direction and two in the lateral direction.

Figure 20:
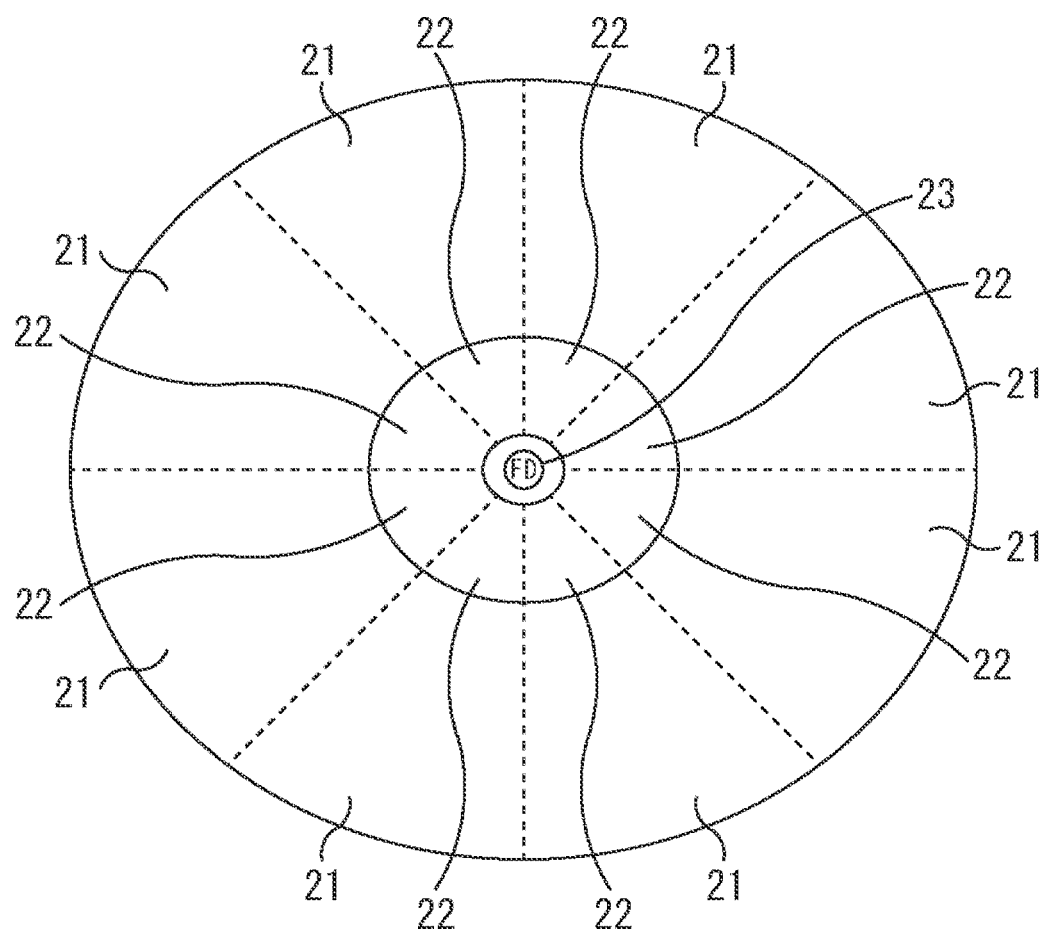
FIG. 20 is a diagram to describe a modified example of the number in one sharing unit.

Additionally, the number of pixels sharing one FD 23, a color filter 32, and an on-chip lens 31 is not also limited to four, and may be arbitrary N (N>1) as illustrated in FIG. 20.

2. Second Embodiment

In a first embodiment described above, described is a configuration capable of performing operation in both of operation modes: a first operation mode in which an image surface phase difference autofocus function and an HDR function are achieved at the same time; and a second operation mode in which the image surface phase difference autofocus function with improved phase difference detection accuracy is achieved.

In a second embodiment described next, a pixel structure that pays attention to the image surface phase difference autofocus function with improved phase difference detection accuracy will be described.

In the second embodiment described below, a portion corresponding to that in the above-described first embodiment is also denoted by a same reference sign, and the description thereof is suitably omitted.

First Pixel Structure

Figure 21:
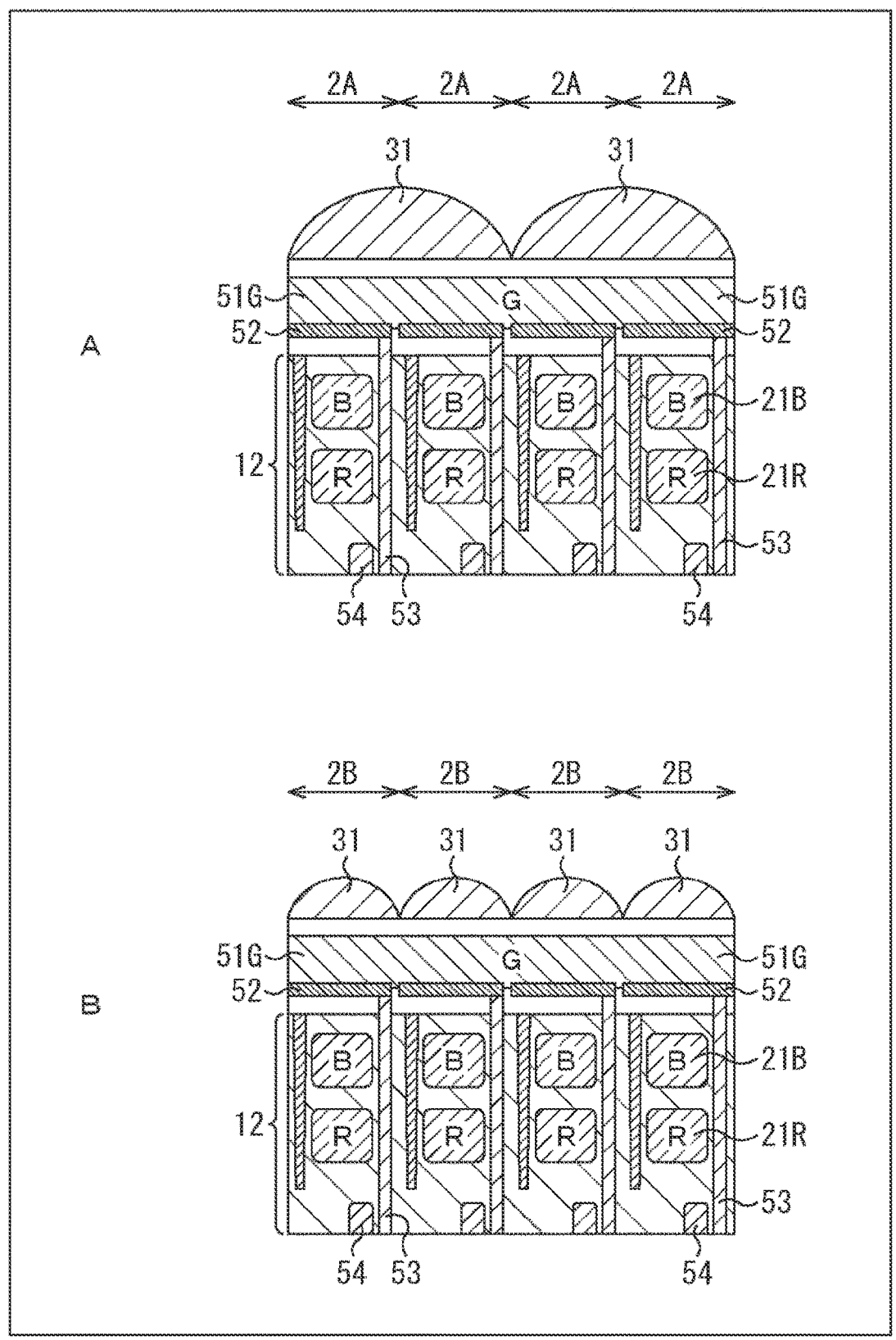
FIG. 21 provides cross-sectional views illustrating a first pixel structure according to a second embodiment.

FIG. 21 is a cross-sectional view illustrating a first pixel structure according to the second embodiment.

In the second embodiment, a plurality of pixels 2 inside a pixel array unit 3 includes a pixel used for the purpose of not only image generation by using a pixel signal thereof but also phase difference detection (hereinafter referred to as "dual purpose pixel 2A") and a pixel used only as an imaging signal for the purpose of image generation and not used in phase difference detection (hereinafter referred to as "normal purpose pixel 2B").

A of FIG. 21 illustrates a pixel structure of dual purpose pixels 2A, and B of FIG. 21 illustrates a pixel structure of normal purpose pixels 2B.

In the first pixel structure according to the second embodiment, photodiodes 21B and 21R formed by P-N junction are stacked in a depth direction inside a semiconductor substrate 12. The photodiode 21B photoelectrically converts B light, and the photodiode 21R photoelectrically converts R light. Additionally, a photoelectric conversion film 51G that photoelectrically converts G light, a pixel electrode 52 formed individually in each pixel, and the like are formed on an upper surface side (light incident side) of the semiconductor substrate 12.

With this structure, a pixel 2 having the first pixel structure of the second embodiment can output pixel signals SIG_R, SIG_G, and SIG_B of R, G, and B, respectively.

As it can be understood from comparison between A and B of FIG. 21, a formed region of one on-chip lens 31 is different between the dual purpose pixel 2A and the normal purpose pixel 2B.

Figure 22:
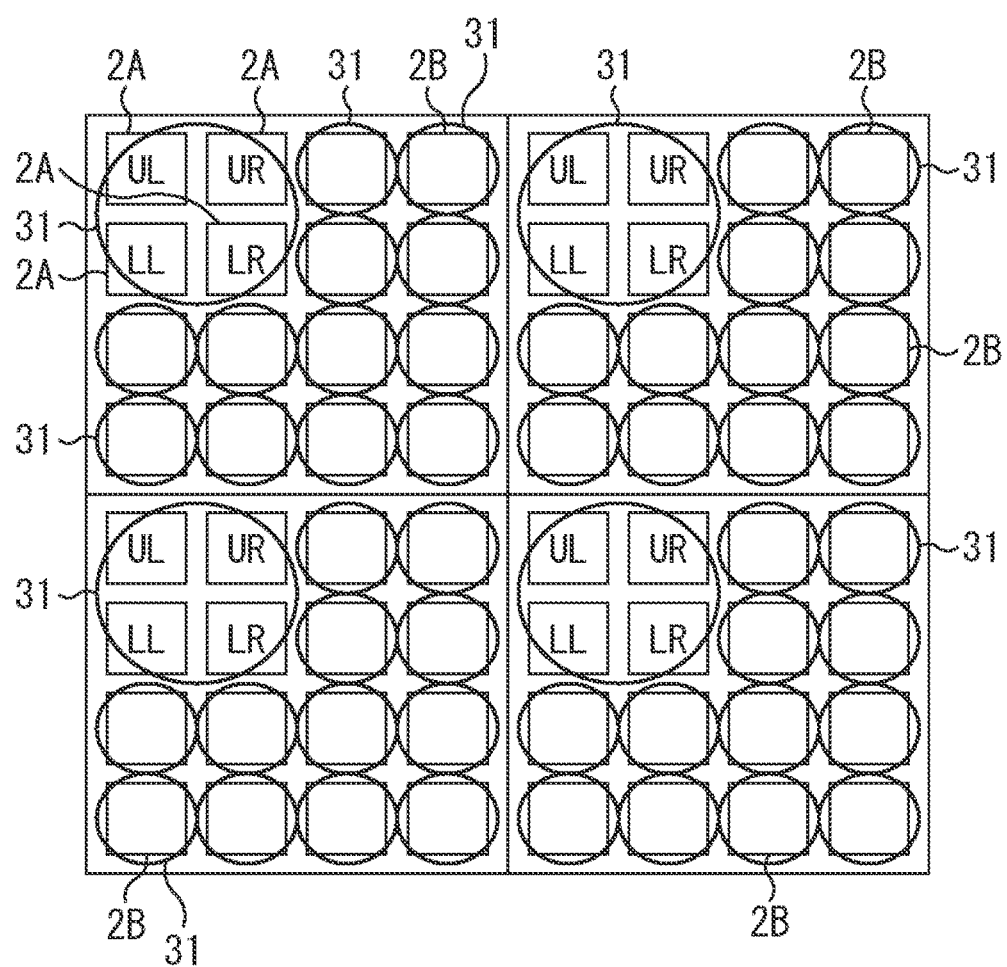
FIG. 22 is a plan view illustrating arrangement of on-chip lenses in the first pixel structure of the second embodiment.

FIG. 22 is a plan view illustrating arrangement of on-chip lenses 31 in the first pixel structure of the second embodiment.

As for the dual purpose pixel 2A, one on-chip lens 31 is formed for four pixels including two in a vertical direction and two in a lateral direction in a manner similar to the above-described first embodiment. On the other hand, as for the normal purpose pixel 2B, one on-chip lens 31 is formed per pixel.

In a case of defining an upper right dual purpose pixel 2A as $2A_{UR}$, a lower right dual purpose pixel 2A as $2A_{LR}$, an upper left dual purpose pixel 2A as $2A_{UL}$, and a lower left dual purpose pixel 2A as $2A_{LL}$ among the four dual purpose pixels 2A including two in the vertical direction and two in the lateral direction and arranged under one on-chip lens 31, pixel signals $SIG\_R_{UR}$, $SIG\_G_{UR}$, and $SIG\_B_{UR}$ of the respective R, G, and B can obtained from the upper light dual purpose pixel $2A_{UR}$. Similarly, pixel signals $SIG\_R_{LR}$, $SIG\_G_{LR}$, and $SIG\_B_{LR}$ of the respective R, G, and B can be obtained from the lower right dual purpose pixel $2A_{LR}$, pixel signals $SIG\_R_{UL}$, $SIG\_G_{UL}$, and $SIG\_B_{UL}$ of the respective R, G, and B can be obtained from the upper left dual purpose pixel $2A_{UL}$, and pixel signals $SIG\_R_{LL}$, $SIG\_G_{LL}$, and $SIG\_B_{LL}$ of the respective R, G, and B can be obtained from the lower left dual purpose pixel $2A_{LL}$.

In a signal processing unit (such as an output circuit 7 or a DSP circuit arranged in a latter stage of a solid-state imaging device 1) that applies signal processing to respective pixel signals SIG_R, SIG_G, and SIG_B of the respective R, G, and B output from each of the dual purpose pixels 2A of the pixel array unit 3, a phase difference in a first direction (vertical direction) can be detected for the pixel signals SIG_R, SIG_G, and SIG_B of the respective R, G, and B by comparing an added signal obtained by adding upper two pixels including the upper right dual purpose pixel $2A_{UR}$ and the upper left dual purpose pixel $2A_{UL}$ with an added signal obtained by adding lower two pixels including the lower right dual purpose pixel $2A_{LR}$ and the lower left dual purpose pixel $2A_{LL}$ as described with reference to A of FIG. 11.

Additionally, as described with reference to B of FIG. 11, a phase difference in a second direction (lateral direction) can be detected for the pixel signals SIG_R, SIG_G, and SIG_B of the respective R, G, and B by comparing an added signal obtained by adding the right two pixels including the upper right dual purpose pixel $2A_{UR}$ and the lower right dual purpose pixel $2A_{LR}$ with an added signal obtained by adding the left two pixels including the upper left dual purpose pixel $2A_{UL}$ and the lower left dual purpose pixel $2A_{LL}$.

Furthermore, a phase difference in a third direction (left oblique direction) can be detected by comparing the pixel signals SIG_R, SIG_G, and SIG_B between the two dual purpose pixels 2A arranged in the upper left dual purpose pixel $2A_{UL}$ and the lower right dual purpose pixel $2A_{LR}$, and a phase difference in a fourth direction (right oblique direction) can be detected by comparing the pixel signals SIG_R, SIG_G, and SIG_B between the two dual purpose pixels 2A arranged in the upper right dual purpose pixel $2A_{UR}$ and the lower left dual purpose pixel $2A_{LL}$.

As a result, the phase differences can be detected in the four directions including the vertical direction, lateral direction, left oblique direction, and right oblique direction, and therefore, the phase difference detection accuracy can be improved.

On the other hand, an imaging signal in a dual purpose pixel 2A is calculated as follows. First, pixel signals SIG of four dual purpose pixel $2A_{UR}$, $2A_{LR}$, $2A_{UL}$ and $2A_{UR}$ arranged under one on-chip lens 31 are added and averaged. Then, an imaging signal is calculated by executing, for each of the dual purpose pixels 2A under the on-chip lens 31, interpolation processing on the basis of pixel signals SIG of normal purpose pixels 2B in the periphery thereof. The above processing is executed for the pixel signals SIG_R, SIG_G, and SIG_B of the respective R, G, and B. As a result, an imaging signal having a resolution same as that of a normal purpose pixel 2B can also be obtained in a dual purpose pixel 2A.

Figure 23:
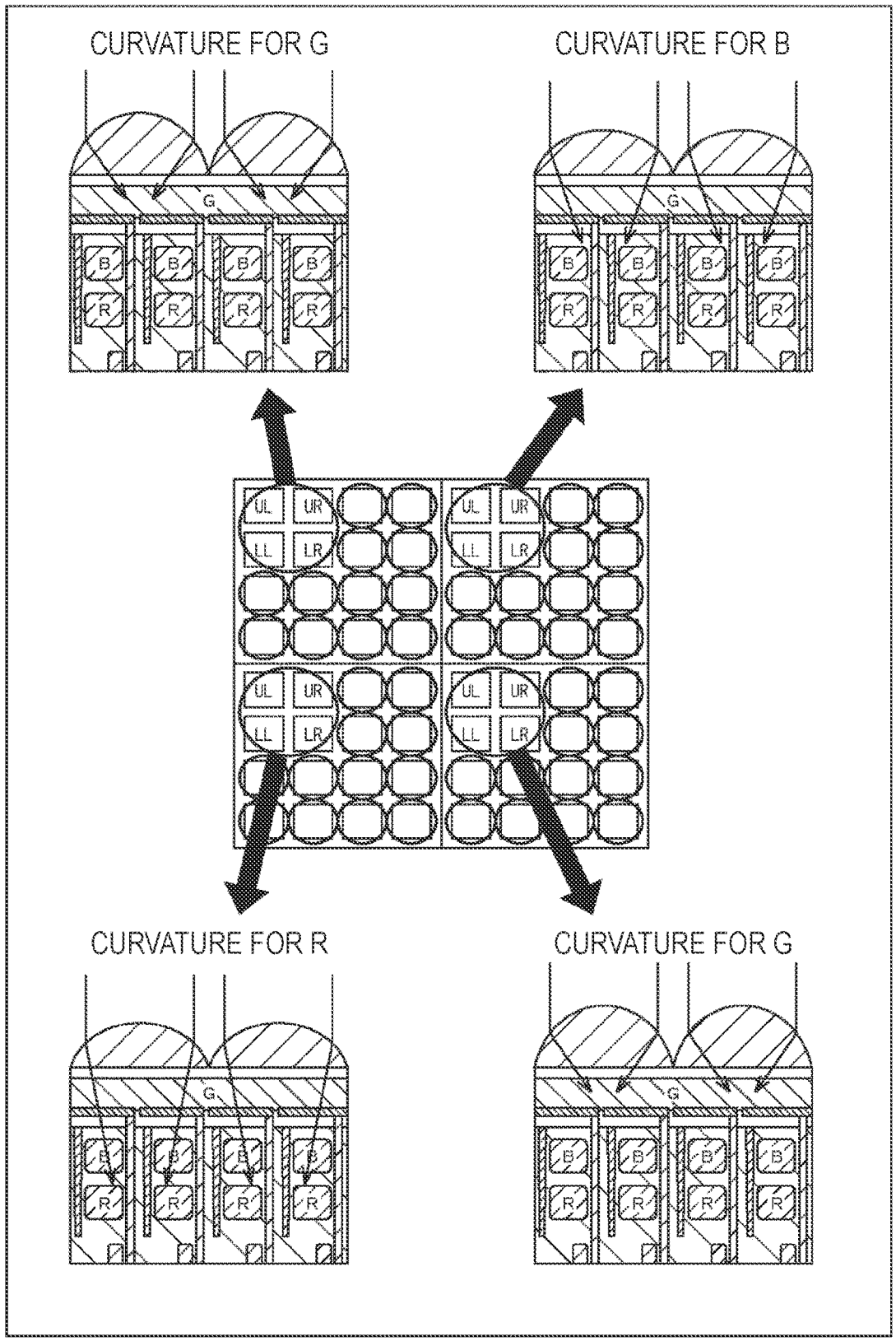
FIG. 23 is a diagram to describe a curvature of an on-chip lens.

Note that a curvature of an on-chip lens 31 formed on a dual purpose pixel 2A may be the same in all of on-chip lenses 31 inside the pixel array unit 3, or for example, an on-chip lens 31 having a curvature for G and focusing on a photoelectric conversion film 51G, an on-chip lens 31 having a curvature for R and focusing on a photodiode 21R, and an on-chip lens 31 having a curvature for B and focusing on a photodiode 21B may be arranged in accordance with a predetermined rule as illustrated in FIG. 23. In this case, a phase difference signal optimized for each of the colors R, G, and B can be acquired.

Second Pixel Structure

Figure 24:
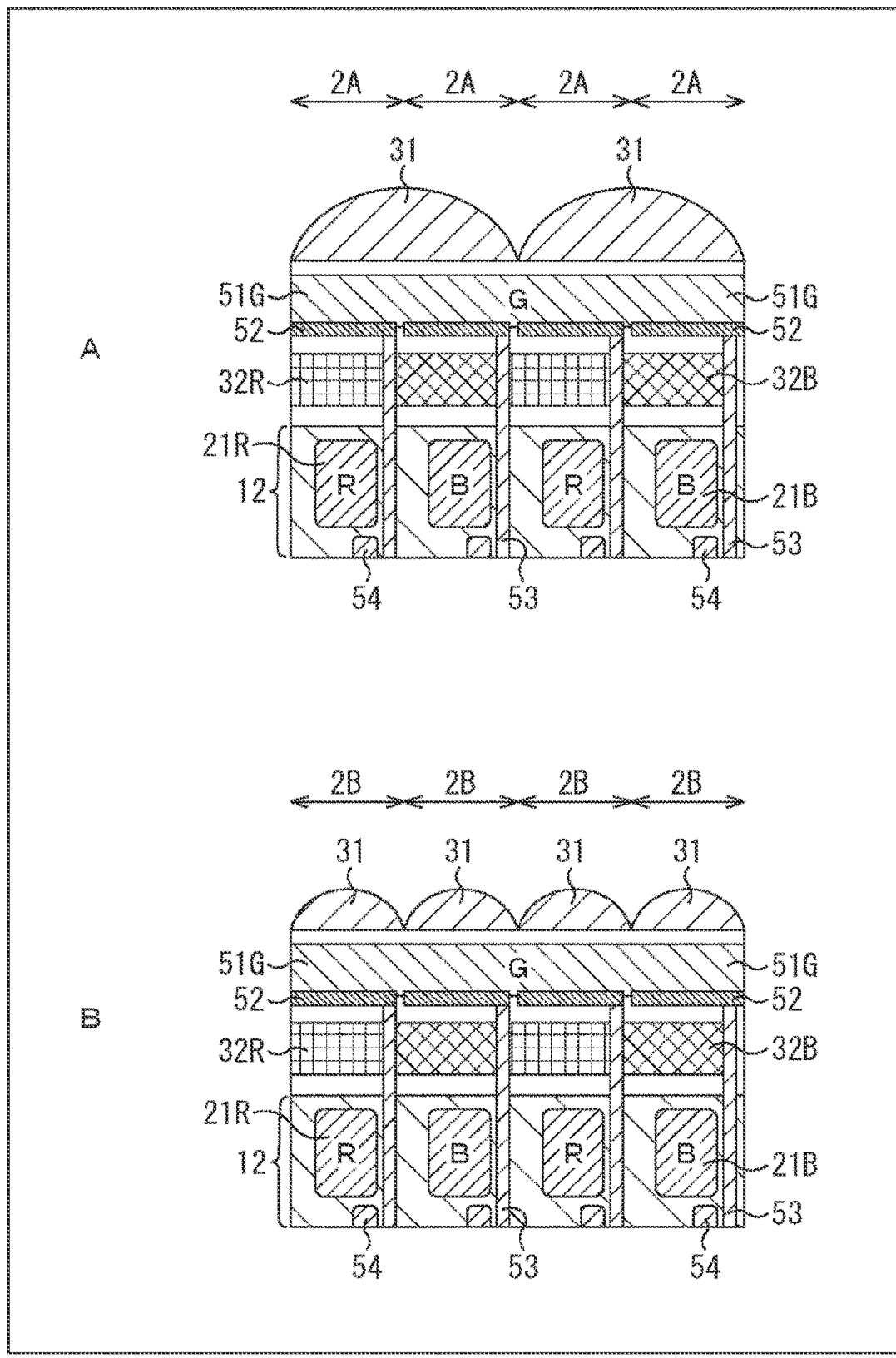
FIG. 24 provides cross-sectional views illustrating a second pixel structure according the second embodiment.

FIG. 24 is a cross-sectional view illustrating a second pixel structure according to the second embodiment.

In the second pixel structure also, a plurality of pixels 2 arrayed in a matrix is arranged inside the pixel array unit 3 in a state in dual purpose pixels 2A and a normal purpose pixels 2B are separated from each other.

A of FIG. 24 illustrates a pixel structure of dual purpose pixels 2A, and B of FIG. 24 illustrates a pixel structure of normal purpose pixels 2B.

In the second pixel structure, one photodiode 21 formed by P-N junction is formed inside the semiconductor substrate 12. A G photoelectric conversion film 51G, a pixel electrode 52, and the like are formed on the upper surface side (light incident side) of the semiconductor substrate 12. Additionally, a color filter 32 is formed between the photoelectric conversion film 51G and the upper surface of the semiconductor substrate 12. As for color filters 32, there are a pixel 2 where an R color filter 32R is formed and a pixel 2 where a B color filter 32B is formed.

Figure 25:
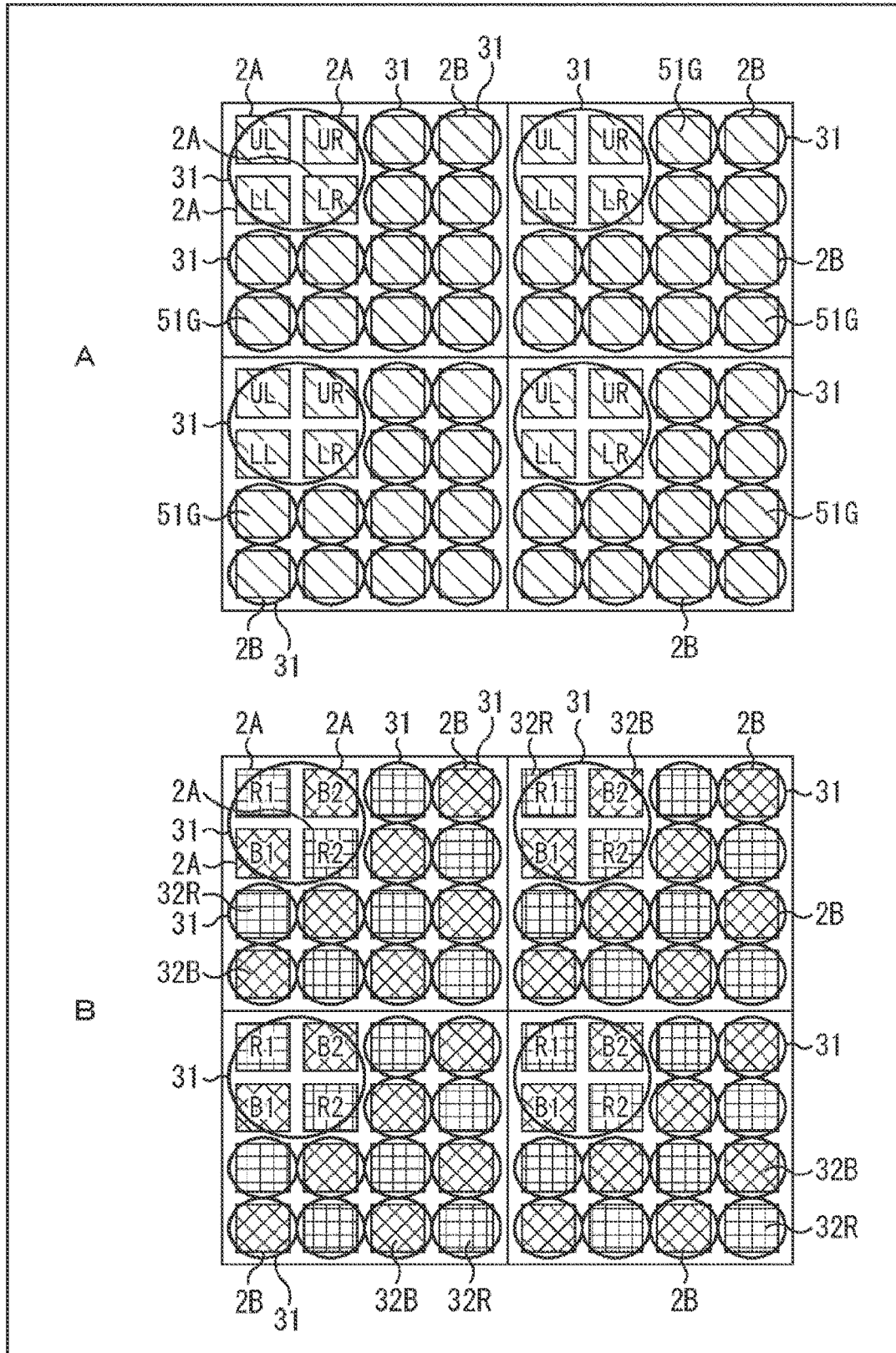
FIG. 25 provides plan views illustrating arrangement of on-chip lenses, photoelectric conversion films, and color filters.

A of FIG. 25 is a plan view illustrating arrangement of on-chip lenses 31 and photoelectric conversion films 51G. B in FIG. 25 is a plan view illustrating arrangement of on-chip lenses 31 and color filters 32.

An on-chip lens 31 is formed in a manner similar to the first pixel structure described with reference to FIG. 22. In other words, as for dual purpose pixels 2A, one on-chip lens 31 is formed for four pixels including two in the vertical direction and two in lateral direction, and as for a normal purpose pixel 2B, one on-chip lens 31 is formed per pixel.

The photoelectric conversion films 51G are formed for all of pixels in the pixel array unit 3.

As illustrated in B of FIG. 25, an R color filter 32R and a B color filter 32B are alternately arranged in the vertical direction and the lateral direction of the pixel array unit 3.

As illustrated in the cross-sectional views of FIG. 24, a photodiode 21 formed in a pixel 2 where an R color filter 32R is arranged becomes a photodiode 21R that photoelectrically converts R light, and a photodiode 21 formed in a pixel 2 where a B color filter 32B is arranged becomes a photodiode 21B that photoelectrically converts B light.

Therefore, each of the pixels 2 in the second pixel structure of the second embodiment outputs two kinds (two colors) of pixel signals SIG: any one of a R pixel signal SIG_R and a B pixel signal SIG_B; and a G pixel signal SIG_G.

In the second pixel structure of the second embodiment, a phase difference is detected by using a G pixel signal SIG_G output from a dual purpose pixel 2A.

In other words, as for the G pixel signal SIG_G, a phase difference in the first direction (vertical direction) can be detected by comparing an added signal of upper two pixels obtained by adding a G pixel signal SIG_$G_{UR}$ of an upper right dual purpose pixel 2$A_{UR}$ and a G pixel signal SIG_$G_{UL}$ of an upper left dual purpose pixel 2$A_{UL}$ with an added signal of lower two pixels obtained by adding a G pixel signal SIG_$G_{LR}$ of a lower right dual purpose pixel 2$A_{LR}$ and a G pixel signal SIG_$G_{LL}$ of a lower left dual purpose pixel 2$A_{LL}$.

Furthermore, a phase difference in the second direction (lateral direction) can be detected by comparing an added signal of right two pixels obtained by adding a G pixel signal SIG_$G_{UR}$ of the upper right dual purpose pixel 2$A_{UR}$ and a G pixel signal SIG_$G_{LR}$ of the lower right dual purpose pixel 2$A_{LR}$ with an added signal of left two pixels obtained by adding a G pixel signal SIG_$G_{UL}$ of the upper left dual purpose pixel 2$A_{UL}$ and a G pixel signal SIG_$G_{LL}$ of the lower left dual purpose pixel 2$A_{LL}$.

Additionally, a phase difference in a third direction (left oblique direction) is detected by comparing the G pixel signals SIG_G of two dual purpose pixels 2A arranged in the upper left dual purpose pixel 2$A_{UL}$ and the lower right dual purpose pixel 2$A_{LR}$, and a phase difference in a fourth direction (right oblique direction) is detected by comparing the G pixel signals SIG_G of two dual purpose pixels 2A arranged in the upper right dual purpose pixel 2$A_{UR}$ and the lower left dual purpose pixel 2$A_{LL}$.

As a result, the phase differences in the four directions including the vertical direction, lateral direction, left oblique direction, and right oblique direction can be detected by using the G pixel signals SIG_G, and therefore, the phase difference detection accuracy can be improved.

An R pixel signal SIG_R and a B pixel signal SIG_B are not necessarily used to detect a phase difference, or may be used only to detect a phase difference in the third direction (left oblique direction) and fourth direction (right oblique direction) in a manner similar to a G pixel signal SIG_G.

As for an imaging signal in a dual purpose pixel 2A, a G imaging signal is calculated by performing averaging processing and interpolation processing by using G pixel signals SIG_G of four dual purpose pixels 2$A_{UR}$, 2$A_{LR}$, 2$A_{UL}$, and 2$A_{UR}$ arranged under one on-chip lens 31 in a manner similar to the case of the above-described first pixel structure.

As for R and B imaging signals, R pixel signals SIG_R acquired from the dual purpose pixels 2$A_{UL}$ and 2$A_{LR}$ out of the four dual purpose pixels 2$A_{UR}$, 2$A_{LR}$, 2$A_{UL}$ and 2$A_{LL}$ arranged under one on-chip lens 31 are defined as pixel signals SIG_R1 and SIG_R2, and B pixel signals SIG_B acquired from the dual purpose pixel 2$A_{LL}$ and 2$A_{UR}$ are defined as pixel signals SIG_B1 and SIG_B2. An R imaging signal is calculated by performing the averaging processing and interpolation processing by using the pixel signals SIG_R1 and SIG_R2 acquired from the dual purpose pixels 2$A_{UL}$ and 2$A_{LR}$ each including an R color filter 32R. A B imaging signal is calculated by performing the averaging processing and interpolation processing by using pixel signals SIG_B1 and SIG_B2 acquired from the dual purpose pixels 2$A_{LL}$ and 2$A_{UR}$ each including a B color filter 32B. As a result, an imaging signal having a resolution same as that of a normal purpose pixel 2B can also be obtained in a dual purpose pixel 2A.

Third Pixel Structure

Figure 26:
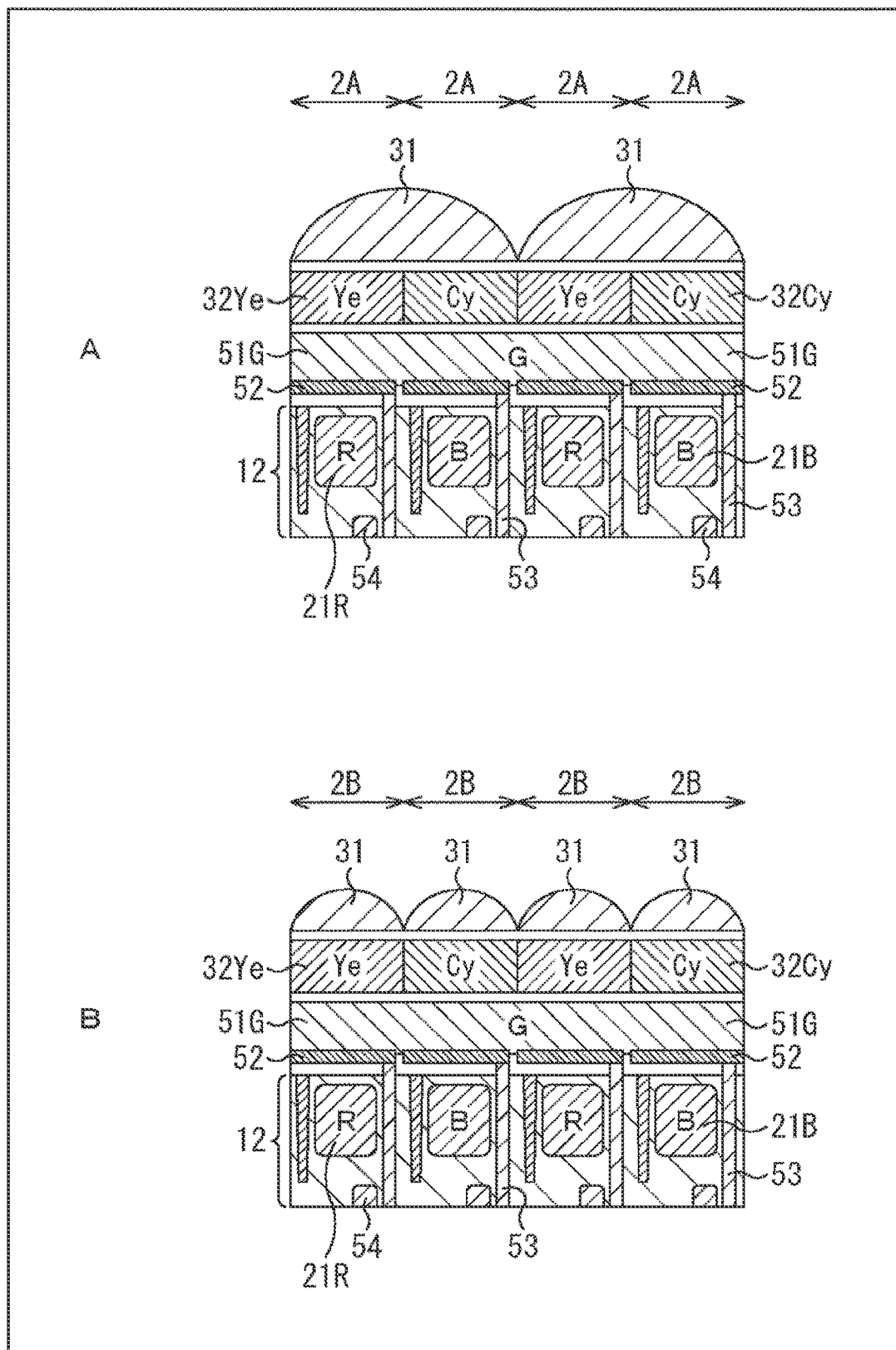
FIG. 26 provides cross-sectional views illustrating a third pixel structure according the second embodiment.

FIG. 26 provides cross-sectional views illustrating a third pixel structure according to the second embodiment.

A of FIG. 26 illustrates a pixel structure of dual purpose pixels 2A, and B of FIG. 26 illustrates pixel structure of normal purpose pixels 2B.

In the second pixel structure illustrated in FIG. 24, the R color filter 32R and B color filter 32B of primary colors are formed as the color filters 32, but the third pixel structure illustrated in FIG. 26 is different in that a yellow (Ye) color filter 32Ye and a cyan (Cy) color filter 32Cy of complementary colors are formed. Additionally, the R color filter 32R and B color filter 32B are arranged under the G photoelectric conversion film 51G in the second pixel structure while the Ye color filter 32Ye and the Cy color filter 32Cy are arranged on an upper side of the G photoelectric conversion film 51G in the third pixel structure.

As illustrated in FIG. 26, a photodiode 21 formed in a pixel 2 where a Ye color filter 32Ye is arranged becomes a photodiode 21R that photoelectrically converts R light, and a photodiode 21 formed in a pixel 2 where a Cy color filter 32Cy is arranged becomes a photodiode 21B that photoelectrically converts B light.

Other portions of the pixel structure are similar to the second pixel structure. Phase difference detection and calculation of an imaging signal can also be executed in a manner similar to the above-described second pixel structure. With this structure, phase difference detection accuracy can be also improved in the third pixel structure of the second embodiment, and furthermore, an image signal having a resolution same as that of a normal purpose pixel 2B can also be obtained in a dual purpose pixel 2A.

3. Exemplary Configuration of Electronic Apparatus

The present disclosure is not limited to application to a solid-state imaging device. In other words, the present technology can be applied to all kinds of electronic apparatuses using a solid-state imaging device in an image capturing unit (photoelectric conversion unit), for example, an imaging device such as a digital still camera or a video camera, a portable terminal device having an imaging function, and a copy machine using a solid-state imaging device in an image reading unit. The solid-state imaging device may have a configuration formed as one chip, and also a module-like configuration having an imaging function in which an imaging unit and a signal processing unit or an optical system are packaged as one.

Figure 27:
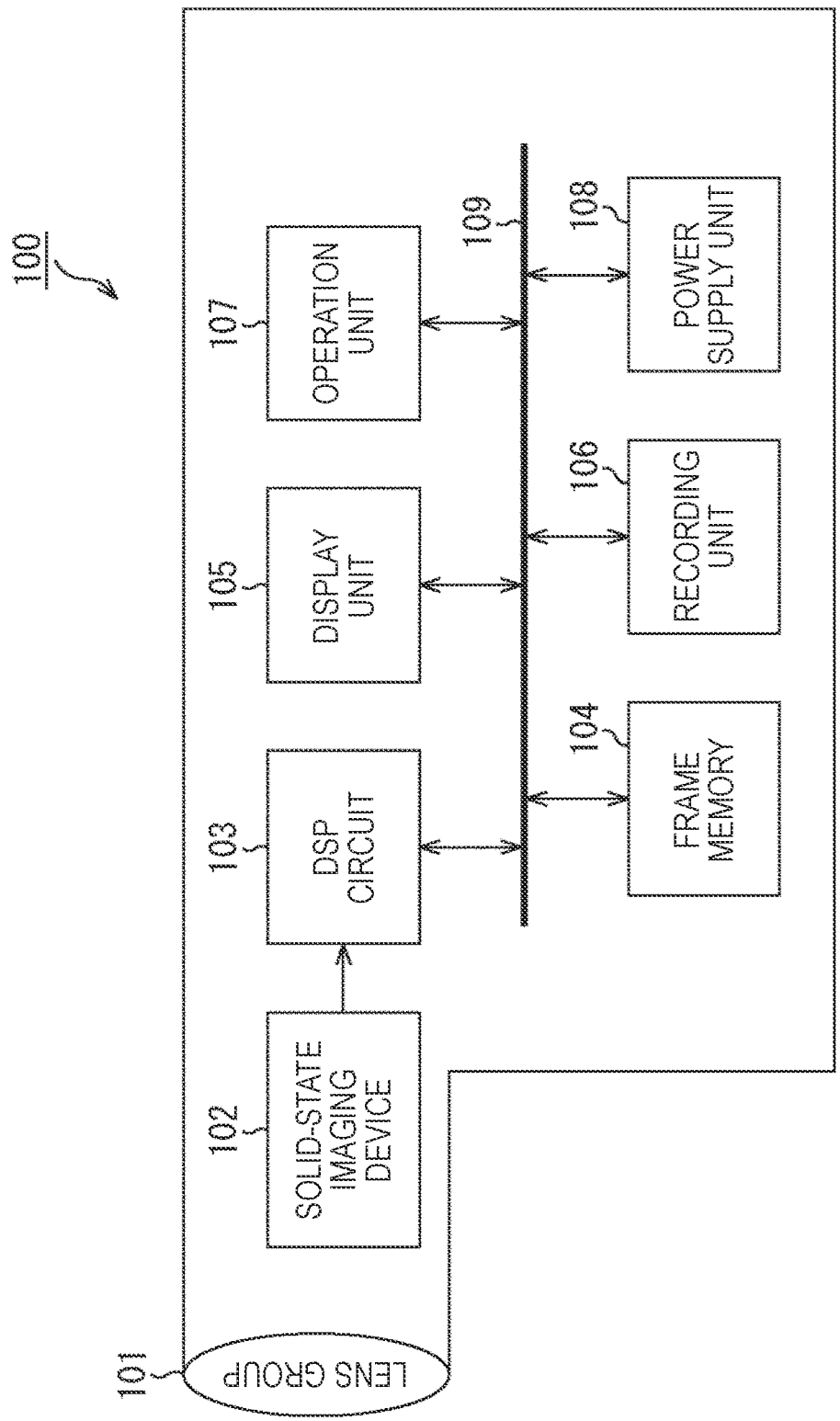
FIG. 27 is a block diagram illustrating an exemplary configuration of an imaging device as an electronic apparatus to which the present technology is applied.

FIG. 27 is a block diagram illustrating an exemplary configuration of an imaging device as an electronic apparatus to which the present technology is applied.

An imaging device 100 in FIG. 27 includes an optical unit 101 including a lens group and the like, a solid-state imaging device (imaging device) 102 adopting the configuration of the solid-state imaging device 1 in FIG. 1, and a digital signal processor (DSP) circuit 103 that is a camera signal processing circuit. Additionally, the imaging device 100 includes a frame memory 104, a display unit 105, a recording unit 106, an operation unit 107, and a power supply unit 108. The DSP circuit 103, frame memory 104, display unit 105, recording unit 106, operation unit 107, and power supply unit 108 are mutually connected via a bus line 109.

The optical unit 101 takes in incident light (image light) from a subject and forms an image on an imaging surface of the solid-state imaging device 102. The solid-state imaging device 102 converts, to an electrical signal, a light amount of the incident light formed on an imaging surface by the optical unit 101 per pixel, and outputs the electric signal as a pixel signal. As the solid-state imaging device 102, the solid-state imaging device 1 according to the first embodiment or the second embodiment described above can be used.

The display unit 105 includes, for example, a panel type display device such as a liquid crystal panel or an organic electro luminescence (EL) panel, and displays a moving image or a still image picked up by the solid-state imaging device 102. The recording unit 106 records the moving image or the still image captured by the solid-state imaging device 102 in a recording medium such as a hard disk and a semiconductor memory.

The operation unit 107 provides an operational command for various kinds of functions owned by the imaging device 100 under control of a user. The power supply unit 108 suitably supplies various kinds of power supply serving as operation power sources of the DSP circuit 103, frame memory 104, display unit 105, recording unit 106, and operation unit 107 to these supply targets.

As described above, since the solid-state imaging device 1 according to the above-described first embodiment is used as the solid-state imaging device 102, the image surface phase difference autofocus function and the HDR function can be achieved at the same time, and a signal to detect a phase difference and a signal to generate a high dynamic range image can be acquired at the same time by performing drive in the first operation mode. Additionally, the image surface phase difference autofocus function with improved phase difference detection accuracy can be achieved by performing the drive in the second operation mode.

Additionally, the image surface phase difference autofocus function with improved phase difference detection accuracy can be achieved by using the solid-state imaging device 1 according to the second embodiment as the solid-state imaging device 102.

Therefore, image quality of a captured image can be improved also in the imaging device 100 such as a video camera, a digital still camera, and furthermore, a camera module for a mobile apparatus such as a mobile phone.

An embodiment of the present technology is not limited to the above-described embodiments, and various kinds of modifications can be made within a range not departing from a gist of the present technology.

Exemplary Uses of Image Sensor

Figure 28:
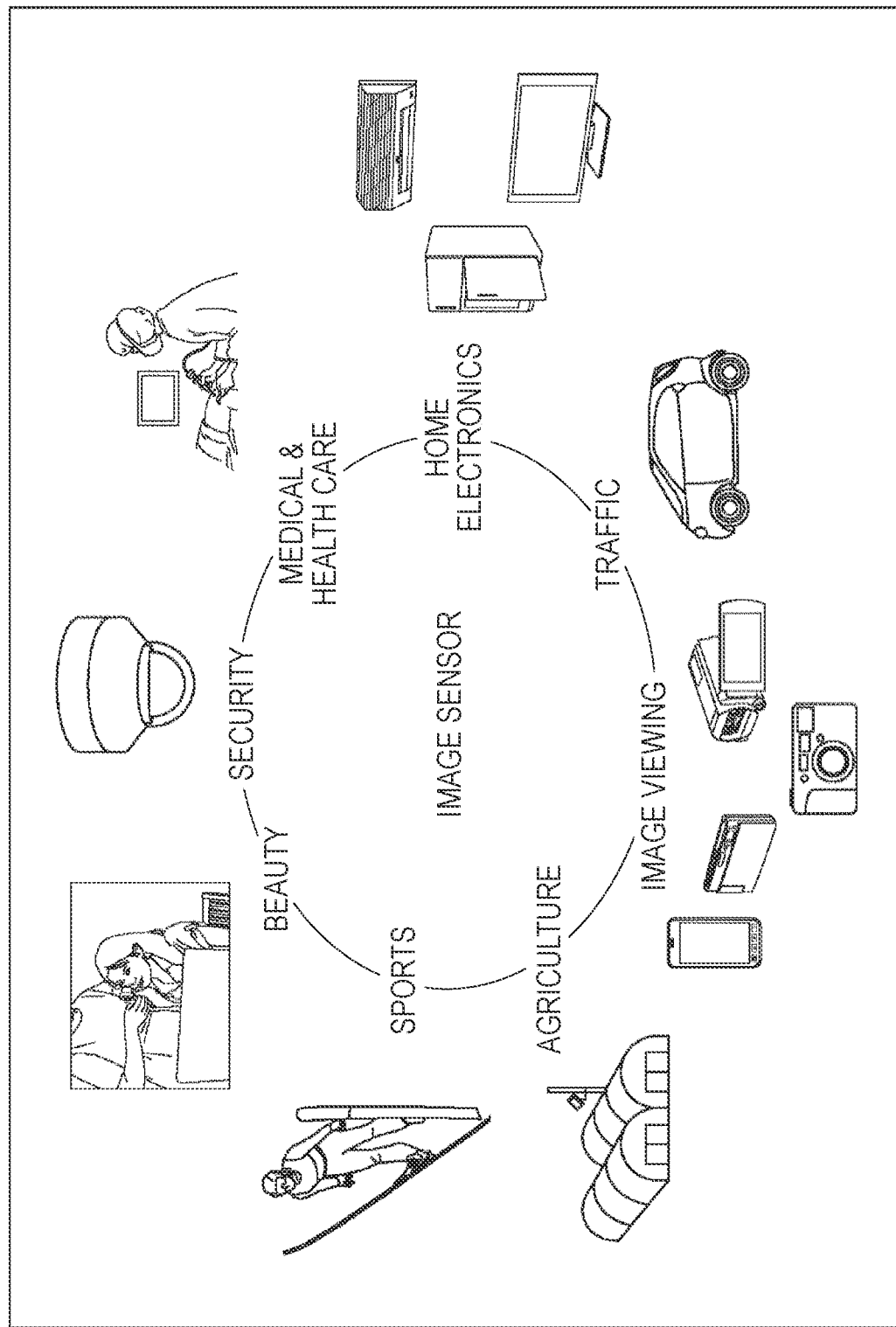
FIG. 28 is a diagram illustrating exemplary uses of the solid-state imaging device in FIG. 1.

FIG. 28 is a diagram illustrating exemplary uses in a case of using the above-described solid-state imaging device 1 as an image sensor.

An image sensor using the above-described solid-state imaging device 1 can be used in various cases of sensing light such as visible light, infrared light, ultraviolet light, and X-rays as described below, for example.

- Device to take a photographic image to be provided for image viewing in a digital camera, a portable apparatus incorporated with a camera function, and the like
- Device provided for traffic, such as an on-vehicle sensor to photograph a front side, a back side, a periphery of a vehicle, a car interior, and the like, a monitoring camera to monitor a traveling vehicle and a road, and a ranging sensor to measure a distance between vehicles and the like in order to perform safety drive such as automatic stop, recognize driver's condition, and the like.
- Device provided for home electronics such as a television, a refrigerator, and an air conditioner in order to photograph a user's gesture and operate these apparatuses in accordance with the gesture
- Device provided for medical and health care, such as an endoscope and a device to photograph a blood vessel by receiving infrared light
- Device provided for security, such as a monitoring camera for crime prevention, and a camera for person authentication
- Device provided for beauty care, such as skin measurement instrument to photograph skin, and a microscope to photograph a scalp
- Device provided for sports and the like, such as an action camera and a wearable camera used in sports
- Device provided for agriculture, such as a camera to monitor condition of fields and crops.

Additionally, application of the present technology is not limited to application to a solid-state imaging device that detects distribution of incident light amounts of visible light and captures the distribution as an image, and the present technology is applicable to a solid-state imaging device that captures, as an image, distribution of indecent light amounts of infrared, X-ray, particles, or the like, and in a broad sense, applicable to all kinds of solid-state imaging devices (physical amount distribution detection devices) such as a fingerprint detection sensor that detects distribution of other physical amounts like pressure, electrostatic capacitance, and the like and captures the distribution as an image.

Furthermore, the present technology is applicable not only to a solid-state imaging device but also to all kinds of semiconductor devices having a different semiconductor integrated circuit.

An embodiment of the present technology is not limited to the above-described embodiments, and various kinds of modifications can be made within a range not departing from a gist of the present technology.

For example, an embodiment combining all or part of the above-described plurality of embodiments can be adopted.

Note that the effects recited in the present specification are merely examples and not limited thereto, and effects other than those recited in the present specification may also be provided.

Note that the present technology may also adopt the following configurations.

(1)
A solid-state imaging device including a pixel array unit in which a plurality of pixels that receives light of a same color is arranged under one on-chip lens,
in which the plurality of pixels uses at least one pixel transistor in a sharing manner, and
some pixels out of the plurality of pixels are set to have a first exposure time, and other pixels are set to have a second exposure time shorter than the first exposure time.

(2)
The solid-state imaging device recited in (1) above, in which four pixels including two pixels in a vertical direction and two pixels in a lateral direction are arranged under the one on-chip lens.

(3)
The solid-state imaging device recited in (1) or (2) above, in which the plurality of pixels for which a same exposure time is set is arrayed in an oblique direction.

(4)
The solid-state imaging device recited in any one of (1) to (3) above, in which pixel signals of the pixels for which a same exposure time is set are used to detect a phase difference.

(5)
The solid-state imaging device recited in any one of (1) to (4) above, in which a pixel signal of the pixel for which the first exposure time is set and a pixel signal of the pixel for which the second exposure time is set are used to generate a high dynamic range image.

(6)
The solid-state imaging device recited in any one of (1) to (5) above, in which the plurality of pixels arranged under the one on-chip lens uses a reset transistor, an amplification transistor, and a selection transistor in a sharing manner.

(7)
The solid-state imaging device recited in any one of (1) to (6) above,
in which the plurality of pixels arranged under the one on-chip lens uses a floating diffusion region in a sharing manner, and
pixel signals of at least two pixels arranged under the one on-chip lens are added at the floating diffusion region and then output.

(8)
The solid-state imaging device recited in any one of (1) to (7) above, in which the solid-state imaging device has a pixel structure in which a transistor region formed with a pixel transistor and a photodiode region formed with a photodiode are stacked.

(9)
The solid-state imaging device recited in any one of (1) to (7) above, in which the solid-state imaging device has a pixel structure in which two photodiodes formed at different depth positions inside a semiconductor substrate and a photoelectric conversion film formed on the semiconductor substrate are stacked.

(10)
The solid-state imaging device recited in any one of (1) to (7) above, in which the solid-state imaging device has a pixel structure in which a photodiode formed inside a semiconductor substrate and a photoelectric conversion film formed on the semiconductor substrate are stacked.

(11)
The solid-state imaging device recited in (10) above, in which a color filter of a complementary color is provided on the semiconductor substrate.

(12)
The solid-state imaging device recited in (10) above, in which a color filter of a primary color is provided on the semiconductor substrate.

(13)
The solid-state imaging device recited in any one of (1) to (12) above, in which the solid-state imaging device also has an operation mode in which all of pixels arranged under the one on-chip lens are set to a same exposure time.

(14)
A driving method for a solid-state imaging device including a pixel array unit in which a plurality of pixels that receives light of a same color is arranged under one on-chip lens,
in which the plurality of pixels uses at least one pixel transistor in a sharing manner, and
some pixels out of the plurality of pixels are set to have a first exposure time, and other pixels are set to have a second exposure time shorter than the first exposure time.

(15)
An electronic apparatus provided with a solid-state imaging device including a pixel array unit in which a plurality of pixels that receives light of a same color is arranged under one on-chip lens,
in which the plurality of pixels uses at least one pixel transistor in a sharing manner, and
some pixels out of the plurality of pixels are set to have a first exposure time, and other pixels are set to have a second exposure time shorter than the first exposure time.

(B1)
A solid-state imaging device including a first on-chip lens formed on a plurality of pixels, and a second on-chip lens formed on one pixel,
in which each pixel includes at least a first photoelectric conversion unit formed on a semiconductor substrate and a second photoelectric conversion unit formed inside the semiconductor substrate, and
a pixel signal obtained by the first photoelectric conversion unit in a pixel arranged under the first on-chip lens is used to detect a phase difference.

(B2)
The solid-state imaging device recited in (B1) above,
in which not only the second photoelectric conversion unit but also a third photoelectric conversion unit are stacked in each pixel, and
pixel signals obtained by the second photoelectric conversion unit and the third photoelectric conversion unit in a pixel arranged under the first on-chip lens are also used to detect a phase difference.

(B3)

The solid-state imaging device recited in (B1) or (B2) above, including a color filter of a primary color on the semiconductor substrate, in which the first photoelectric conversion unit photoelectrically converts G light, and the second photoelectric conversion unit photoelectrically converts R or B light.

(B4)

The solid-state imaging device recited in (B1) or (B2) above, including a color filter of a complementary color on the semiconductor substrate, in which the first photoelectric conversion unit photoelectrically converts G light, and the second photoelectric conversion unit photoelectrically converts R or B light.

(B5)

The solid-state imaging device recited in any one of (B1) to (B3), in which an on-chip lens focusing on the first photoelectric conversion unit and an on-chip lens focusing on the second photoelectric conversion unit are provided as the first on-chip lens.

(B6)

An electronic apparatus including a solid-state imaging device having a first on-chip lens formed on a plurality of pixels, and a second on-chip lens formed on one pixel, in which each pixel has at least a first photoelectric conversion unit formed on a semiconductor substrate and a second photoelectric conversion unit formed inside the semiconductor substrate, and a pixel signal obtained by the first photoelectric conversion unit of a pixel arranged under the first on-chip lens is used to detect a phase difference.

REFERENCE SIGNS LIST

1 Solid-state imaging device
2 Pixel
2A Dual purpose pixel
2B Normal purpose pixel
3 Pixel array unit
5 Column signal processing circuit
12 Semiconductor substrate
21 Photodiode
22 Transfer transistor
23 Floating diffusion region (FD)
24 Reset transistor
25 Amplification transistor
26 Selection transistor
31 On-chip lens
32 Color filter
51 Photoelectric conversion film
52 Pixel electrode
100 Imaging device
102 Solid-state imaging device
103 DSP circuit

The invention claimed is:

1. An imaging device, comprising:
a floating diffusion region;
a plurality of photoelectric conversion regions coupled to the floating diffusion region, the plurality of photoelectric conversion regions including sixteen photoelectric conversion regions arranged in a matrix;
sixteen transfer transistors, wherein each of the photoelectric conversion regions is associated with a respective transfer transistor;
a reset transistor;
an amplification transistor;
a select transistor; and
four on-chip lenses, wherein each on-chip lens is disposed above a respective four of the photoelectric conversion regions.

2. The imaging device of claim 1, wherein a first four of the transfer transistors are connected to a first signal line, eight of the transfer transistors are connected to a second signal line, and a second four of the transfer transistors are connected to a third signal line.

3. The imaging device of claim 2, wherein the first four of the transfer transistors are associated with a first four of the photoelectric conversion region, the eight of the transfer transistors are associated with a first four of the photoelectric conversion region, and the second four of the transfer transistors are associated with a second four of the photoelectric conversion region.

4. The imaging device of claim 3, wherein each of the first four photoelectric conversion regions are in different rows of the matrix, each of the second four photoelectric conversion regions are in different rows of the matrix, each of the first four photoelectric conversion regions are in one of a first two columns of the matrix, and each of the second four photoelectric conversion regions are in a second two columns of the matrix.

5. The imaging device of claim 1, wherein the matrix is a four-by-four matrix.

6. The imaging device of claim 1, wherein a first photoelectric conversion region of the plurality of photoelectric conversion regions is disposed in a first row and a first column, a second photoelectric conversion region of the plurality of photoelectric conversion regions is disposed in the first row and a second column, a third photoelectric conversion region of the plurality of photoelectric conversion regions is disposed in a second row and the first column, a fourth photoelectric conversion region of the plurality of photoelectric conversion regions is disposed in the second row and the second column, and each of the photoelectric conversion regions share the floating diffusion region.

7. The imaging device of claim 1, wherein the reset transistor, the amplification transistor, and the select transistor are used by each of the photoelectric conversion regions.

8. An electronic apparatus comprising a solid-state imaging device, the solid-state imaging device comprising:
a floating diffusion region;
a plurality of photoelectric conversion regions coupled to the floating diffusion region, the plurality of photoelectric conversion regions including sixteen photoelectric conversion regions arranged in a matrix;
sixteen transfer transistors, wherein each of the photoelectric conversion regions is associated with a respective transfer transistor;
a reset transistor;
an amplification transistor;
a select transistor; and
four on-chip lenses, wherein each on-chip lens is disposed above a respective four of the photoelectric conversion regions.

9. The electronic apparatus of claim 8, wherein a first four of the transfer transistors are connected to a first signal line, eight of the transfer transistors are connected to a second signal line, and a second four of the transfer transistors are connected to a third signal line.

10. The electronic apparatus of claim 9, wherein the first four of the transfer transistors are associated with a first four of the photoelectric conversion region, the eight of the transfer transistors are associated with a first four of the photoelectric conversion region, and the second four of the transfer transistors are associated with a second four of the photoelectric conversion region.

11. The electronic apparatus of claim 10, wherein each of the first four photoelectric conversion regions are in different rows of the matrix, each of the second four photoelectric conversion regions are in different rows of the matrix, each of the first four photoelectric conversion regions are in one of a first two columns of the matrix, and each of the second four photoelectric conversion regions are in a second two columns of the matrix.

12. The electronic apparatus of claim 8, wherein the matrix is a four-by-four matrix.

13. The electronic apparatus of claim 8, wherein a first photoelectric conversion region of the plurality of photoelectric conversion regions is disposed in a first row and a first column, a second photoelectric conversion region of the plurality of photoelectric conversion regions is disposed in the first row and a second column, a third photoelectric conversion region of the plurality of photoelectric conversion regions is disposed in a second row and the first column, a fourth photoelectric conversion region of the plurality of photoelectric conversion regions is disposed in the second row and the second column, and each of the photoelectric conversion regions share the floating diffusion region.

14. The electronic apparatus of claim 8, wherein the reset transistor, the amplification transistor, and the select transistor are used by each of the photoelectric conversion regions.

15. A driving method for a solid-state imaging device, wherein:
the solid-state imaging device comprises:
    a floating diffusion region;
    a plurality of photoelectric conversion regions coupled to the floating diffusion region, the plurality of photoelectric conversion regions including sixteen photoelectric conversion regions arranged in a matrix;
    sixteen transfer transistors, wherein each of the photoelectric conversion regions is associated with a respective transfer transistor;
    a reset transistor;
    an amplification transistor;
    a select transistor; and
    four on-chip lenses, wherein each on-chip lens is disposed above a respective four of the photoelectric conversion regions; and
the method comprises using a pixel signal output by each of the photoelectric conversion regions for phase detection and image generation.

16. The method of claim 15, wherein a first four of the transfer transistors are connected to a first signal line, eight of the transfer transistors are connected to a second signal line, and a second four of the transfer transistors are connected to a third signal line.

17. The method of claim 16, wherein the first four of the transfer transistors are associated with a first four of the photoelectric conversion region, the eight of the transfer transistors are associated with a first four of the photoelectric conversion region, and the second four of the transfer transistors are associated with a second four of the photoelectric conversion region.

18. The method of claim 17, wherein each of the first four photoelectric conversion regions are in different rows of the matrix, each of the second four photoelectric conversion regions are in different rows of the matrix, each of the first four photoelectric conversion regions are in one of a first two columns of the matrix, and each of the second four photoelectric conversion regions are in a second two columns of the matrix.

19. The method of claim 15, wherein the matrix is a four-by-four matrix.

20. The method of claim 15, wherein a first photoelectric conversion region of the plurality of photoelectric conversion regions is disposed in a first row and a first column, a second photoelectric conversion region of the plurality of photoelectric conversion regions is disposed in the first row and a second column, a third photoelectric conversion region of the plurality of photoelectric conversion regions is disposed in a second row and the first column, a fourth photoelectric conversion region of the plurality of photoelectric conversion regions is disposed in the second row and the second column, and each of the photoelectric conversion regions share the floating diffusion region.

* * * * *